(12) United States Patent
Uchiyama et al.

(10) Patent No.: US 12,147,012 B2
(45) Date of Patent: Nov. 19, 2024

(54) OPTICAL ELEMENT AND METHOD FOR MANUFACTURING THE SAME

(71) Applicant: Panasonic Intellectual Property Management Co., Ltd., Osaka (JP)

(72) Inventors: Hirokazu Uchiyama, Osaka (JP); Masaki Hashimoto, Osaka (JP); Nobuo Itazu, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 566 days.

(21) Appl. No.: 17/438,383

(22) PCT Filed: Mar. 10, 2020

(86) PCT No.: PCT/JP2020/011315
§ 371 (c)(1),
(2) Date: Sep. 10, 2021

(87) PCT Pub. No.: WO2020/184727
PCT Pub. Date: Sep. 17, 2020

(65) Prior Publication Data
US 2022/0155492 A1    May 19, 2022

(30) Foreign Application Priority Data

Mar. 13, 2019    (JP) .................. 2019-046426

(51) Int. Cl.
G02B 1/18    (2015.01)
G02B 1/115    (2015.01)
G02B 1/14    (2015.01)

(52) U.S. Cl.
CPC .............. *G02B 1/14* (2015.01); *G02B 1/115* (2013.01)

(58) Field of Classification Search
CPC . G02B 1/04; G02B 1/14; G02B 1/115; G02B 1/18; G02B 1/11; G02B 1/118
See application file for complete search history.

(56) References Cited

U.S. PATENT DOCUMENTS

2002/0105728 A1    8/2002   Yamaguchi et al.
2014/0329072 A1    11/2014  Hirasawa et al.
(Continued)

FOREIGN PATENT DOCUMENTS

CN    103376480 A    10/2013
JP    H10-208673 A   8/1998
(Continued)

OTHER PUBLICATIONS

Decision of Rejection dated Mar. 27, 2023 issued in the corresponding Chinese Patent Application No. 202080020360.1, with English machine translation.
(Continued)

*Primary Examiner* — Ryan D Howard
(74) *Attorney, Agent, or Firm* — Rimon P.C.

(57) ABSTRACT

There is provided a method for manufacturing an optical element comprising a base material, and a stack covering of layers formed on the base material. The method of the present disclosure comprises a multi-layers forming step for forming an optical multi-layered part of the stack covering, and an outermost surface forming step for forming an outermost surface part of the stack covering. A pressure condition for the formation of the stack covering is made discontinuous between the multi-layers forming step and the outermost surface forming step. In the outermost surface forming step, a silicon oxide-containing layer is formed prior to a formation of a fluorine compound-containing layer.

8 Claims, 8 Drawing Sheets

(56) References Cited

U.S. PATENT DOCUMENTS

| | | |
|---|---|---|
| 2015/0355380 A1 | 12/2015 | Apitz et al. |
| 2017/0160437 A1 | 6/2017 | Nakayama |
| 2019/0016900 A1* | 1/2019 | Hayashi .................. C09D 7/65 |

FOREIGN PATENT DOCUMENTS

| | | |
|---|---|---|
| JP | 2002-174702 A | 6/2002 |
| JP | 2004-050672 A | 2/2004 |
| JP | 2005-292340 A | 10/2005 |
| JP | 2007-206146 A | 8/2007 |
| JP | 2015-230486 A | 12/2015 |
| JP | 2018-159892 A | 10/2018 |
| WO | 2013/118622 A1 | 8/2013 |
| WO | 2015/125498 A1 | 8/2015 |
| WO | 2017/164046 A1 | 9/2017 |
| WO | 2018/012340 A1 | 1/2018 |

OTHER PUBLICATIONS

International Search Report issued in International Patent Application No. PCT/JP2020/011315, mailed May 26, 2020; with English translation.

Notice of Reasons for Refusal dated Nov. 1, 2022 issued in the corresponding Japanese Patent Application No. 2021-505166, with English translation.

Chinese Office Action with Search Report dated Oct. 18, 2022 issued in the corresponding Chinese Patent Application No. 202080020360.1, with English translation.

Notice of Reasons for Refusal dated Mar. 14, 2023 issued in the corresponding Japanese Patent Application No. 2021-505166, with English machine translation.

English translation of the International Preliminary Report on Patentability issued in International Application No. PCT/JP2020/011315, mailed Sep. 23, 2021.

* cited by examiner

OPTICAL ELEMENT AND METHOD FOR MANUFACTURING THE SAME

CROSS-REFERENCE OF RELATED APPLICATIONS

This application is the U.S. National Phase under 35 U.S.C. § 371 of International Patent Application No. PCT/JP2020/011315, filed on Mar. 10, 2020, which in turn claims the benefit of Japanese Application No. 2019-046426, filed on Mar. 13, 2019, the entire disclosures of which Applications are incorporated by reference herein.

TECHNICAL FIELD

The present disclosure relates to an optical element, and a method for manufacturing the optical element. More specifically, it relates to the method for manufacturing the optical element having a more suitable characteristic feature of surface, and also relates to the optical element obtained through such manufacturing method.

BACKGROUND ART

PATENT DOCUMENT 1 (JP-A-2005-292340) discloses an optical element which is provided with a layer having many fluorine atoms at the surface thereof, and exhibits a weather resistance. PATENT DOCUMENT 2 (JP-A-2018-159892) also discloses an optical element which has a water-repellent film on its glass lens, the film having fluorine atoms to improve a wear resistance for the water-repellent film.

PATENT DOCUMENT (RELATED ART PATENT DOCUMENT)

PATENT DOCUMENT 1: JP-A-2005-292340
PATENT DOCUMENT 2: JP-A-2018-159892

SUMMARY OF THE INVENTION

Problems to be Solved by the Invention

It is an object of the present disclosure to provide an optical element which is improved in terms of both antiweatherability and abrasion resistance.

Means for Solving the Problems

A manufacturing method according to the present disclosure is a method for manufacturing an optical element comprising a base material, and a stack covering of layers formed on the base material, the method comprising:
a multi-layers forming step for forming an optical multi-layered part of the stack covering of layers, and an outermost surface forming step for forming an outermost surface part of the stack covering of layers,
wherein a pressure condition for the formation of the stack covering is made discontinuous between the multi-layers forming step and the outermost surface forming step, and
wherein, in the outermost surface forming step, a silicon oxide-containing layer is formed prior to a formation of a fluorine compound-containing layer.
An optical element according to the present disclosure comprises a base material and a stack covering of layers formed on the base material,
wherein the stack covering of layers is composed of an optical multi-layered part and an outermost surface part, and
wherein the outermost surface part comprises a silicon oxide-containing layer and a fluorine compound-containing layer, and the fluorine compound-containing layer is a layer having bumps and dents of surface.

Effect of the Invention

In accordance with the present disclosure, an optical element having both antiweatherability and abrasion resistance is provided. More specifically, both of the improved antiweatherability and abrasion resistance can be given in the optical element with its silicon oxide-containing layer as the outermost surface formed prior to the formation of the fluorine compound-containing layer by the discontinuous pressure condition with respect to the formation of the multi-layers forming step.

MODES FOR CARRYING OUT THE INVENTION

Figure 1:
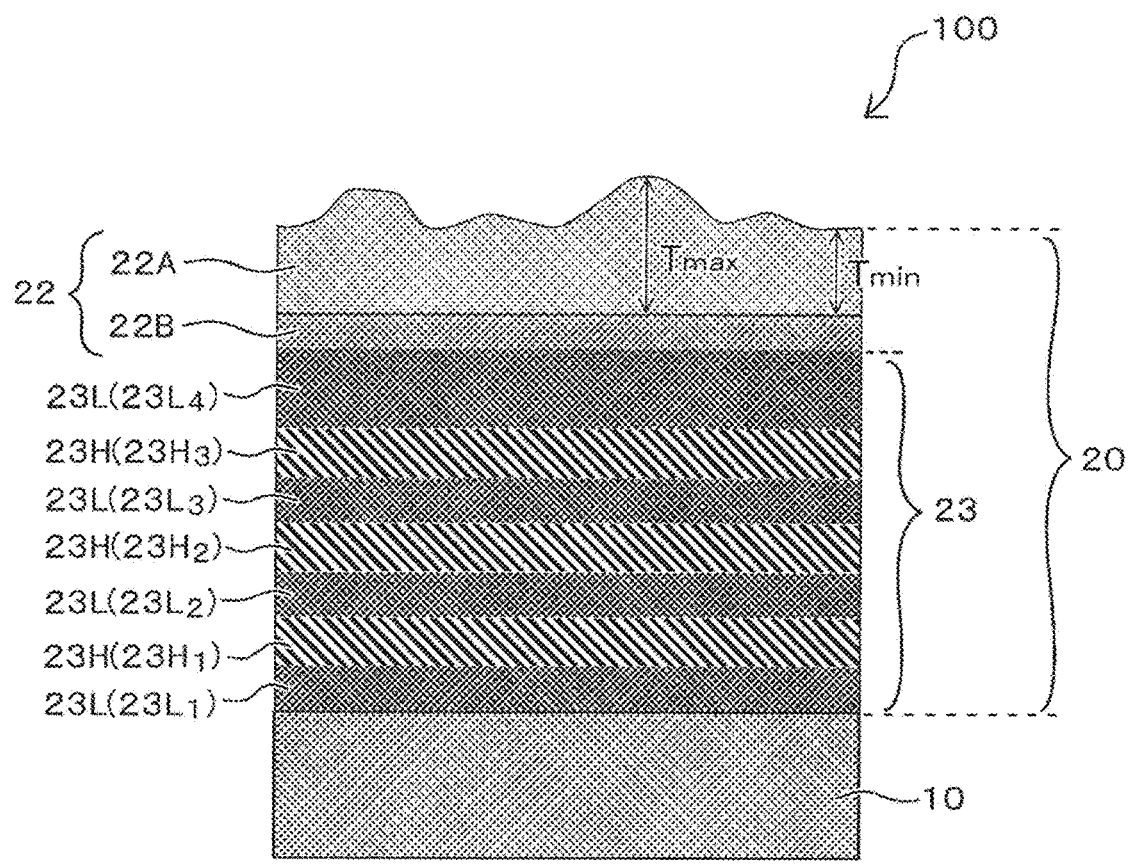
FIG. 1 is a schematic cross-sectional view showing an optical element according to one embodiment of the present disclosure.

[Findings on which the Present Disclosure are Based]
Conventionally, optical elements comprising a resin material or a glass material have been used for various applications. For example, they are used as optical fibers, lens, and the like.

In recent years, such optical elements are used in the field of exterior purposes, such as optical lens for surveillance systems for disaster prevention and/or crime prevention, and also lens for vehicle-mounted view cameras.

When the optical element is used for the exterior lens, it is important for such optical element to have a desired characteristic property of its surface.

The inventors of this application have noted that a conventional method of manufacturing an optical element still has problems to be solved, and have found a necessity to take measures against the problems associated with the conventional method. Specifically, the inventors of this application have found the following problems.

It is known that a covering with its various characteristics is provided with respect to a base material of an optical element by a coating method or a vapor deposition method. For example, it is proposed that a favorable antiweatherability of an optical element is provided by forming of a layer containing many fluorine atoms at the surface of the optical element. It is also proposed that a glass lens and a water-repellent film containing fluorine atoms are provided in an optical element to improve the wear resistance of the water-repellent film.

However, the water-repellent film as described above just involves an improvement of the wear resistance with respect to the water repellency, and thus it does not provide a favorable antiweatherability (a favorable light resistance in particular). Thus, there is a possibility that the optical element having such water-repellent film does not exhibit a sufficient performance in a case where the optical element is used under a severe condition for the exterior one (for example, it is used as a lens for vehicle-mounted view camera).

The inventors of this application have attempted to address the problems described above, from a novel standpoint rather than a continual standpoint of the conventional art. As a result, the inventors of this application have created an optical element having both of desired antiweatherability and abrasion resistance.

Hereinafter, the optical element according to the present disclosure will be described in more detail. In some cases, however, a specific description more than necessary will not be given. For example, a detailed description on a well-known matter, or a duplicate description on a substantially identical structure/configuration will not be given in some cases. This is because of avoiding a redundant description any more than necessary and thus facilitating the better understanding of those skilled in the art.

The applicant provides the attached drawings and the following descriptions in order for those skilled in the art to sufficiently understand the present disclosure, but they are not intended to limit the subject matter of this disclosure to the claims. In the drawings, constituent parts/members/elements are schematically exemplified for the understanding of an optical element and a manufacturing method therefor according to the present disclosure, and thus they can be different from actual ones in terms of an outer appearance and a dimensional ratio for example.

As used herein, the term "optical element" means refers to a member through which light is transmittable. Thus, the optical element is a lens, a prism or a mirror, for example. Moreover, the optical element may also be, for example, a window product associated with a light transmission.

The term "cross-sectional view" as used herein is based on a cross section taken along a thickness direction of an optical element. In other words, the cross section refers to one taken along the thickness direction of the optical element, and thus a cross-sectional view in the present disclosure can correspond to a view of such cross section. Typically, the "thickness direction of optical element" can correspond to a direction in which light transmits through the optical element.

[Manufacturing Method of Optical Element of the Present Disclosure]

A manufacturing method according to the present disclosure is one for manufacturing an optical element comprising a base material, and a stack covering of layers formed on the base material. The manufacturing method is featured at least by the pressure condition for a formation of a stack covering.

The manufacturing method of the present disclosure includes a multi-layers forming step and an outermost surface forming step. The multi-layers forming step is one for forming an optical multi-layered part of the stack covering of layers. The outermost surface forming step is one for forming an outermost surface part of the stack covering of layers. FIG. 1 illustrates a cross-sectional view of the optical element 100. The optical element 100 has, as the stack covering 20, the optical multi-layered part 23 and the outermost surface part 22 provided thereon. In other words, the forming of such optical multi-layered part 23 is performed as the multi-layers forming step, and whereas the forming of such outermost surface part 22 is performed as the outermost surface forming step. In the manufacturing method of the present disclosure, the pressure condition for the formation of the stack covering of layers is made discontinuous between the multi-layers forming step and the outermost surface forming step.

More specifically, the formation of the optical multi-layered part of the stack covering is performed in the multi-layers forming step, and thereafter the formation of the outermost surface part of the stack covering is performed in the outermost surface forming step. The pressure condition is not continuously retained upon transferring the steps from the multi-layers forming step to the outermost surface forming step. For example, in a case where the formation of the stack covering regarding the optical multi-layered part is performed under the low-pressure condition, and thereafter the formation of the stack covering regarding the outermost surface part is also performed under the low-pressure condition, such low-pressure condition for the formation of the stack covering is once released not to be continuously retained. In other words, prior to the formation of the stack covering as the outermost surface forming step, the pressure condition is once reset.

Such discontinuous pressure condition makes it possible to once sever a formation continuity between the multi-layers forming step and the outermost surface forming step. In other words, the formation of the stack covering can make a fresh start at a point in time prior to the formation of the outermost surface forming step. For example, in the multi-layers forming step wherein a plurality of layers are sequentially formed, the more layers are formed for the stack covering, the rougher the surface of the stack covering can become. If a fluorine compound-containing layer is provided with respect to such surface roughness, a favorable adherence between the fluorine compound-containing layer and the surface of the stack covering is hard to be given due to such surface roughness. The discontinuous pressure condition according to present disclosure facilitates reducing such surface roughness for the stack covering. As an example, the surface roughness can be reduced by thinly forming a layer (i.e., forming a thin layer) on the rough surface, and thereby giving the favorable adherence between the fluorine compound-containing layer and the surface of the stack covering. Prior to the outermost surface forming step, a surface-modifying process may also be performed with respect to the surface of the optical multi-layered part of the stack covering. Such surface-modifying process may be an ion cleaning and/or an oxygen plasma process to give a higher adherence between the optical multi-layered part and the outermost surface part formed thereon.

In the manufacturing method of the present disclosure, the multi-layers forming step and the outermost surface forming step may be both based on a gas phase method. This means that the optical multi-layered part and the outermost surface part of the stack covering may be both formed by the gas phase method. For example, in the multi-layers forming step and the outermost surface forming step, the gas phase method such as PVD (Physical Vapor Deposition) method or CVD (Chemical Vapor Deposition) method may be performed in order to form the optical multi-layered part and the outermost surface part. The PVD method means, in a broader sense, a gas phase method which makes use of physical motion of particles. In a narrower sense, the PVD method is one for forming a layer through an evaporation/gasification of raw material therefor using energy such as heat, plasma or the like. Examples of the PVD method include a vapor deposition method, a sputtering method, an ionic plating method, and MBE (molecular beam epitaxy). The CVD method means, in a broader sense, a gas phase method which makes use of chemical reaction. In a narrower sense, the CVD method is one for forming a layer by applying energy such as heat, light and/or plasma to gas raw material, and thereby providing a decomposition material, a reaction product, or an intermediate product regarding gas molecules of the raw material. Examples of the CVD method include a heat CVD method, a MOCVD (Metal Organic Chemical Vapor Deposition) method, a RF plasma CVD method, a light CVD method, a laser CVD method, and a LPE (Liquid Phase Epitaxy) method.

As for the multi-layers forming step and the outermost surface forming step in the manufacturing method of the present disclosure, the same method as each other may be performed for their layer formation. Alternatively, the multi-layers forming step and the outermost surface forming step may be performed for their layer formation by different methods from each other. Similarly, as for the layer forming of each of the optical multi-layered part and the outermost surface part, all the layers or a part of layers may be formed by the same method as each other, or the different methods from each other.

In an embodiment of the present disclosure, the multi-layers forming step and the outermost surface forming step are based on the vapor deposition method. In other words, both of the optical multi-layered part and the outermost surface part may be formed to provide the stack covering by the vapor deposition method. As the vapor deposition method, a vacuum vapor deposition and/or an ion-assist deposition may be performed. The vacuum vapor deposition can be one for forming a layer as a vapor-deposited film through an evaporation of raw material under vacuum-low pressure. The ion-assist deposition can be one for forming a layer as a vapor-deposited film similarly by the use of vacuum vapor, but combined by a gas ion irradiation in the vacuum vapor.

In a case where the multi-layers forming step and the outermost surface forming step are based on the vapor deposit method, they may be performed under a vacuum-low pressure. In this case, a vacuum-low pressure condition is made discontinuous between the multi-layers forming step and the outermost surface forming step. Namely, in a case where the multi-layers forming step of the stack covering is formed under the vacuum-low pressure, and thereafter the outermost surface forming step of the stack covering is also formed under the vacuum-low pressure, the low-pressure condition is once released not to be continuously retained. This can once sever the formation continuity of the stack covering between the multi-layers forming step and the outermost surface forming step, which makes it possible for the formation of the stack covering to make a fresh start at a point in time prior to the formation for the outermost surface forming step. The term "vacuum-low pressure condition" as used herein means a pressure that is at least lower than an atmosphere pressure, and it substantially means, a low pressure to such extent of what those skilled in the art can regard as a vacuum, rather than means a complete vacuum. As an example, the vacuum-low pressure condition is in the range of $1.0 \times 10^{-5}$ Pa to $1.0 \times 10^{-1}$ Pa, or a pressure condition lower than that. More specifically, the vacuum-low pressure condition may be such that a background pressure is $4.0 \times 10^{-4}$ Pa or lower, and a pressure upon the vapor deposition is in the range of $4.0 \times 10^{-4}$ Pa to $7.0 \times 10^{-2}$ Pa or a pressure condition lower than that.

Just as an example, a closed state of a vacuum vapor apparatus which has been used for the multi-layers forming step is once released after the formation of such multi-layers forming step. This can provide the discontinuous pressure condition for the formation of the stack covering of layers. For example, the vacuum-low pressure condition may be released after the formation of the optical multi-layered part, and then the vacuum-low pressure condition may be made again through an atmospheric pressure to perform the outermost surface forming step. The multi-layers forming step and the outermost surface forming step may be performed using different vacuum vapor apparatuses from each other through the releasing of the vacuum, which can also provide the discontinuous pressure condition for the formation of the stack covering. For example, in a case where the vacuum vapor apparatuses are used, the multi-layers forming step may be performed for the formation of the optical multi-layered part on a base material in the first vacuum vapor apparatus, and thereafter the outermost surface forming step may be performed for the formation of the silicon oxide-containing layer and the fluorine compound-containing layer on the optical multi-layered part in the second vacuum vapor apparatus. The first vacuum vapor apparatus and the second vacuum vapor apparatus are different apparatuses from each other. From a viewpoint of evaporating the raw material for the vapor deposition for the optical multi-layered part, a temperature condition for the multi-layers forming step may be 200° C. or higher and 350° C. or lower. From a viewpoint of the more suitable antiweatherability and abrasion resistance of the fluorine compound-containing layer, a temperature condition for the outermost surface forming step may be 200° C. or lower. For example, the second vacuum vapor apparatus may be used under the condition of no heating.

In the outermost surface forming step according to the present disclosure, the silicon oxide-containing layer is formed prior to the formation of the fluorine compound-containing layer. The outermost surface forming step includes the formation of the fluorine compound-containing layer and also the formation of the silicon oxide-containing layer, in which case the silicon oxide-containing layer is formed prior to the formation of the fluorine compound-containing layer. More specifically, the optical multi-layered part is formed in the outermost surface forming step, and thereafter the silicon oxide-containing layer and the fluorine compound-containing layer are sequentially formed on the optical multi-layered part in the outermost surface forming step through the pressure condition being not made continuous but reset.

The silicon oxide-containing layer formed in the outermost surface forming step may be an additional silicon oxide-containing layer. This will be explained in more detail. For example, in a case where the last layer to be finally formed in the multi-layers forming step is a silicon oxide-containing layer (i.e., in a case where an outermost layer of the optical multi-layered part corresponds to a silicon oxide-containing layer), the outermost surface forming step may be performed such that, on such silicon oxide-containing layer of the optical multi-layered part, the same or similar silicon oxide-containing layer (not the fluorine compound-containing layer) is formed, followed by the formation of the fluorine compound-containing layer. Thus, the silicon oxide-containing layer to be formed in the outermost surface forming step can be regarded as an additional layer, considering the outermost silicon oxide-containing layer of the optical multi-layered part. This "additional silicon oxide-containing layer" can contribute to reducing the surface roughness of the optical multi-layered part. In the multi-layers forming step wherein a plurality of layers are sequentially formed to provide the stack covering of layers, the surface of the resulting stack covering can become rougher as the stacking of layers proceeds, in which case such surface roughness can be reduced by thinly forming the silicon oxide-containing layer on the rough surface. More specifically, the additional silicon oxide-containing layer may be thinly formed such that the dents of the rough surface are filled with such thin layer, which can lead to a suitable provision of the dense silicon oxide-containing film. For example, such dense layer makes it possible to reduce the surface roughness from Ra >5 nm to Ra <2 nm or the like. This can provide a favorable adherence of the fluorine compound-containing layer to be formed on such dense film, the adherence being given between the fluorine compound-containing layer and such film.

In other words, the optical element obtained from such outermost surface forming step has the silicon oxide-containing layer provided prior to the formation of the fluorine compound-containing layer through the discontinuous pressure condition with respect to the optical multi-layered part, and also can have the improved antiweatherability and abrasion resistance. For example, the antiweatherability such as a light resistance, a chemical resistance and/or a moist heat resistance can be improved, and also the abrasion resistance such as a suitable resistance to a surface rubbing or the like can be improved in the optical element.

In an embodiment of the present disclosure, a mixture layer is formed in the outermost surface forming step such that the mixture layer is disposed within the stack covering. More specifically, the mixture layer in which a fluorine compound and a silicon oxide are mixed to each other is formed between the fluorine compound-containing layer and the silicon oxide-containing layer.

Such mixture layer may be formed through a sequential forming of the silicon oxide-containing layer and the fluorine compound-containing layer after the once-resetting of the pressure condition. In a case where the multi-layers forming step and the outermost surface forming step are both based on the vapor deposition method, the formation of the mixture layer can be facilitated. While not wishing to be bound by any particular theory, this is because a silicon oxide component of the silicon oxide-containing layer is suitably interfused into the fluorine compound-containing layer.

The "mixture layer in which a fluorine compound and a silicon oxide are mixed to each other" can more strengthen an adherence between the silicon oxide-containing layer and the fluorine compound-containing layer, which can lead to facilitation of a longer lasting of the light resistance in that a performance degradation attributed to the light such as ultraviolet light, visible light and/or infrared light can be suppressed, and also the longer lasting of the abrasion resistance in that a resistance with respect to the rubbing by an external element can be more improved.

In an embodiment of the present disclosure, the fluorine compound-containing layer is formed as a layer having bumps and dents of surface. In other words, the fluorine compound-containing layer can be an outermost layer of the stack covering in the optical element, in which case the surface of such outermost layer is provided as a surface having a form of bumps and dents.

In the present disclosure, the fluorine compound-containing layer corresponds to a layer provided after the formation of the silicon oxide-containing layer through the discontinuous pressure condition with respect to that of the optical multi-layered part, in which case the bumps and dents of surface of the fluorine compound-containing layer in particular can effectively contribute to the abrasion resistance. While not wishing to be bound by any particular theory, a ductility of the bumps and dents of surface in the fluorine compound-containing layer can make for the abrasion resistance in the present disclosure. As will be described later in more detail, the fluorine compound-containing layer having the bumps and dents can deform such that it follows a force from the friction applied to the surface thereof, making it possible to suitably prevent a wearing of such layer. In particular, when the bumps and dents of a layer surface of the fluorine compound-containing layer is subjected to friction force, the bumps can deform such that they complement the dents corresponding to thinner portions of the layer, and thereby giving a favorable resistance to the friction force. Thus, the optical element having the fluorine compound-containing layer provided with such bumps and dents of surface can exhibit the more favorable abrasion resistance.

The inventors of the present application have found that such bumps and dents of surface can be favorably provided by the formation of the fluorine compound-containing layer after the formation of the silicon oxide-containing layer through the discontinuous pressure condition with respect to that of the optical multi-layered part. In other words, the fluorine compound-containing layer having the favorable bumps and dents of surface in terms of the abrasion resistance is facilitated to be formed by the sequential forming of the silicon oxide-containing layer and the fluorine compound-containing layer after the once-resetting of the pressure condition.

[Optical Element of the Present Disclosure]

The optical element of the present disclosure has a fluorine compound-containing layer as its outermost surface, and at least has the feature associated with such fluorine compound-containing layer. The optical element of the present disclosure can be obtained through a manufacturing method as described above.

More specifically, the optical element of the present disclosure comprises a base material, and a stack covering of layers formed on the base material. The stack covering of layers in the optical element is composed of an optical multi-layered part and an outermost surface part. The outermost surface part of the stack covering comprises a silicon oxide-containing layer and a fluorine compound-containing layer, and the fluorine compound-containing layer is a layer having bumps and dents of surface. Such fluorine compound-containing layer has a lower friction coefficient, and can contribute to the abrasion resistance.

The term "outermost surface part" in the present disclosure may refer to an outermost surface and its vicinity of the stack covering formed on an optical element. Namely, the outermost surface part can refer to an outermost surface layer and at least one layer located therebeneath, preferably the outermost surface layer and one or two layer(s) located beneath the outermost surface layer. As for the illustrated embodiments shown in Figures, the optical element 100 in the cross-sectional view of FIG. 1 has the fluorine compound-containing layer 22A as the outermost surface layer of the stack covering 20.

The fluorine compound-containing layer can have a ductility due to its bumps and dents of surface. More specifically, when a force of friction is applied to the fluorine compound-containing layer, the bumps and dents of the surface can deform such that they follow the applied force, making it possible to suitably prevent a wearing of such layer. In particular, the surface of the fluorine compound-containing layer having the bumps and dents can deform in a follow manner such that a thicker portion of the layer complements a thinner portion of the layer, and thereby making it possible to give a favorable resistance to the applied friction.

According to an embodiment of the present disclosure, a thickness difference in the bumps and dents of surface of the fluorine compound-containing layer is 10 nm or more and 80 nm or less. Such thickness difference of 10 nm or more can facilitate the deformation of the fluorine compound-containing layer such that a thicker portion of the layer complements a thinner portion of the layer, and thereby making it possible to suitably prevent the wearing of such layer. While on the other hand, such thickness difference of 80 nm or less can facilitate suppressing an unintentional surface reflectance of light, and thereby allowing the optical element to be favorably transparent. In other words, when the thickness difference is less than 10 nm, the thicker portion of the layer can be hard to complement the thinner portion of the layer, which can make it hard for the layer surface portion to deform in the follow manner as described above. Similarly, when the thickness difference is more than 80 nm, the unintentional surface reflectance of light can tend to occur. The thickness difference in the bumps and dents of surface of the fluorine compound-containing layer is preferably 10 nm or more and 50 nm or less, for example 20 nm or more and 40 nm or less, or 20 nm or more and 30 nm or less.

Although the term "bumps and dents of surface"/"bumps and dents" in the present disclosure means in a broader sense that the same layer has a raised portion (i.e., bump) and a recessed portion (i.e., dent), such term does not essentially mean what contributes to a directivity of light in optical element such as that of Fresnel lens for example. Namely, the bumps and dents of surface of the fluorine compound-containing layer do not typically have regular or even form in a cross-sectional view, and also they do not typically have angular/sharp form in a cross-sectional view. The bumps and dents of surface in the present disclosure do not correspond to an optical groove or the like as can be provided in Fresnel lens, and thus they may be randomly distributed in the in-plane direction of the fluorine compound-containing layer. Moreover, in the microscopic sense, it is preferred that the outline of the bumps and/or dents of surface in a cross-sectional view is curviform. Similarly, in the microscopic sense, an apex of the outline of the bumps and/or a bottommost outline of the dents may be in rounded form. This curviform or rounded form can more effectively contribute to the provision of the abrasion resistance due to the follow-mannered deformation.

As can be seen from the above, the bumps and dents of surface of the fluorine compound-containing layer can be referred to as "curviform bumps and dents of surface", "irregular bumps and dents of surface", "random bumps and dents of surface" or the like. In a narrower sense, the "bumps and dents of surface"/"bumps and dents" in the present disclosure means those which have the thickness difference of 10 nm or more for example in the same layer. Such thickness difference in the same layer according to the present disclosure can be one obtained from an image took by the use of a transmission electron microscope, i.e., TEM (model JEM-2800 manufactured by JEOL Ltd.) with an acceleration voltage of 200 KV, the image being one for showing a cross-sectional cutout section of the optical element, the cutout section being provided by a focused ion beam device (model FB2200 manufactured by Hitachi Ltd.) with an acceleration voltage of 10 KV to 40 KV.

According to an embodiment of the present disclosure, 10 nm or more and 80 nm or less regarding the preferable thickness difference in the bumps and dents of surface of the fluorine compound-containing layer may be based on a TEM image of the cross-sectional view on an arbitrary portion of the layer. The 10 nm or more and 80 nm or less regarding the thickness difference according to an embodiment of the present disclosure can mean that the difference between the maximum layer thickness and the minimum layer thickness is in such range of 10 nm or more and 80 nm or less in the TEM image of the cross-sectional view on the arbitrary portion of the fluorine compound-containing layer. For example, such thickness difference may be one measured on the basis of the TEM image of the cross-sectional view having the width dimension of 3 µm or less (e.g., the TEM image provided by taking a region having a width dimension of about 300 nm). Specifically, the measurement is such that the maximum layer thickness and the minimum layer thickness are respectively determined on the basis of such TEM image, and thereafter the difference thereof is calculated. Such measurement may be based on five or more of the TEM images of the cross-sectional view, in which case the thickness difference can be regarded as "10 nm or more and 80 nm or less" when it is true for any of the five or more measurements.

As shown in FIG. 1 of the exemplified embodiment of the optical element 100, the stack covering 20 is provided on the base material 10, in which case the fluorine compound-containing layer 22A and a silicon oxide-containing layer 22B are provided such that they form a surface part of the stack covering 20. In other words, the optical element 100 at least comprises the base material 10 and the stack covering 20, in which case the stack covering 20 at least comprises the fluorine compound-containing layer 22A and the silicon oxide-containing layer 22B as its outermost surface part.

The fluorine compound-containing layer 22A has the bumps and dents of surface, and the thickness difference in the bumps and dents of surface is preferably 10 nm or more and 80 nm or less. As for the exemplified embodiment of FIG. 1, the "maximum layer thickness" regarding the bumps and dents of surface corresponds to "$T_{max}$" and whereas the "minimum layer thickness" regarding the bumps and dents of surface corresponds to "$T_{min}$". Thus, an embodiment of the present disclosure is as follows: 10 nm≤$T_{max}$−$T_{min}$≤80 nm.

Figure 2A:
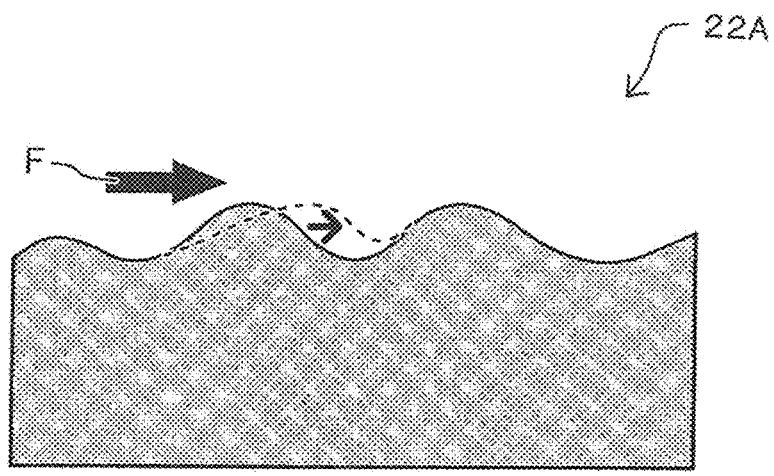
FIGS. 2A to 2C are schematic cross-sectional views each showing a ductility of a fluorine compound-containing layer according to one embodiment of the present disclosure.
Figure 2B:
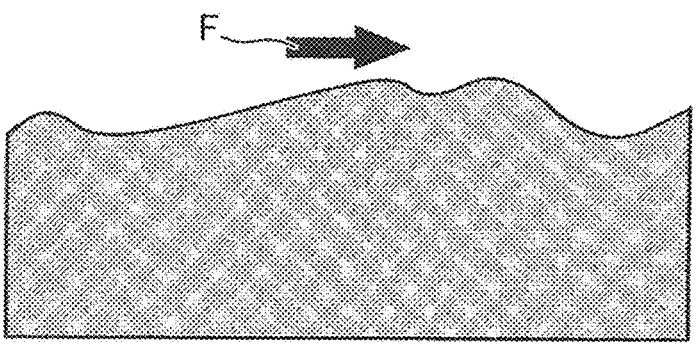
Figure 2C:
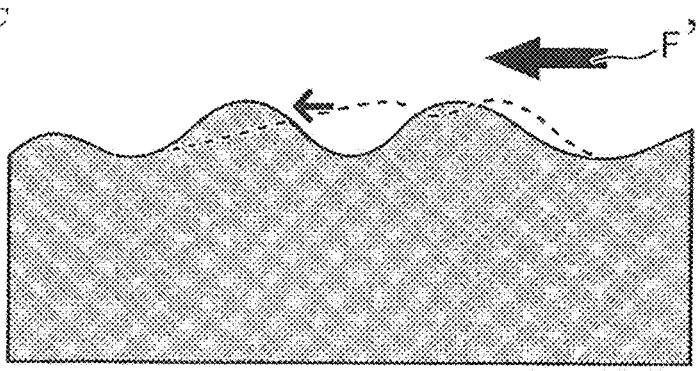

It is preferred that the fluorine compound-containing layer 22A with its bumps and dents of surface has a ductility (in particular, the ductility from the standpoint of a microscopic order from nano to microscopic order). Thus, when the surface of the fluorine compound-containing layer 22A is applied to the friction force F, the surface portion of the layer can deform in a follow manner such that it follows the friction force F (see FIG. 2A). The fluorine compound-containing layer 22A has the thicker portions of the layer (i.e., the bumps) to which the force can be easily transmitted, and thereby such thicker portions can preferentially deform such that they complement the thinner portions of the layer (i.e., the dents). See FIG. 2B. In this regard, when the reverse friction force F' is applied to the fluorine compound-containing layer 22A in a reverse direction with respect to the force F, such a deformation can be brought about that the surface state of the layer is returned to the original one (i.e., the surface state as shown in FIG. 2A), which can be seen in FIG. 2C. Due to such follow-mannered deformation, the fluorine compound-containing layer 22A can have the more favorable abrasion resistance against the friction.

Figure 3A:
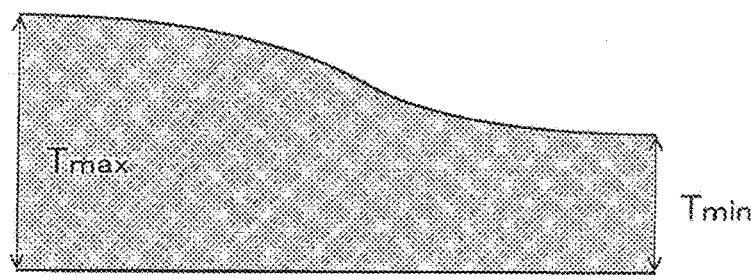
FIGS. 3A and 3B are schematic cross-sectional views each showing a fluorine compound-containing layer according to an embodiment of the present disclosure.

According to an embodiment of the present disclosure, the fluorine compound-containing layer 22A, which is provided with its unevenness of surface, may have the bumps and dents of 10 nm or more and 80 nm or less as the difference between the maximum layer thickness $T_{max}$ and minimum layer thickness $T_{min}$ in the surface area of 0.01 um$^2$ or more and 100 um$^2$ or less (see FIG. 3A). This means that, in the surface area of 0.01 um$^2$ or more and 100 um$^2$ or less of the fluorine compound-containing layer 22A, the thickness difference between the thickness dimension of the thicker layer portions and the thickness dimension of the thinner layer portions may be 10 nm or more and 80 nm or less. The bumps and dents of surface in the surface area of 0.01 um$^2$ or more can provide a wider area of the bumps and dents of surface. This makes it possible to improve the strength of the portion of the bumps and dents as a whole, and thereby more improving the abrasion resistance. While on the other hand, the bumps and dents of surface in the surface area of 100 um$^2$ or less can provide a more densified area of the bumps and dents of surface. This makes it possible for the surface portion of the fluorine compound-containing layer to more easily deform in the follow manner with respect to the friction force. It is preferred that the fluorine compound-containing layer 22A has the bumps and dents of surface in its surface area of 0.02 um$^2$ or more and 20 um$^2$ or less. For example, the bumps and dents of surface are provided in the fluorine compound-containing layer with the layer's surface area of 0.02 um$^2$ or more and 9 um$^2$ or less.

Figure 3B:
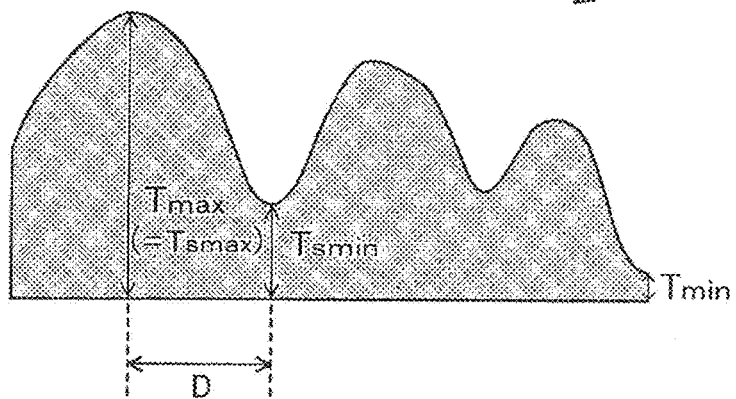

The fluorine compound-containing layer 22A provided with the bumps and dents of surface may have a plurality of the bumps and dents in its surface area of 0.01 um$^2$ or more and 100 um$^2$ or less (see FIG. 3B). According to an embodiment of the present disclosure, the thickness $T_{smax}$ of the bump and the thickness $T_{smin}$ of the dent, in which such bump and dent are adjacent to each other, have the difference therebetween of 10 nm or more and 80 nm or less. In other words, the fluorine compound-containing layer has the difference in its level between an apex of the bump and a bottommost of the dent, the apex and the bottommost being adjacent/neighboring to each other. Such configuration of the fluorine compound-containing layer allows the distance between the thicker portion and the thinner portion of the layer to be smaller in the in-plane direction thereof. This makes it possible for the thicker portion of the layer to more easily deform upon the application of the friction force to the surface of the fluorine compound-containing layer 22A, and thereby the thicker portion of layer can particularly effectively complement the thinner portion of layer. The distance "D" between the adjacent bump and dent in the in-plane direction is preferably 100 nm or more and 10 μm or less, and for example 200 nm or more and 5 pm or less. This can facilitate suppressing a fogging while the favorable abrasion resistance is given.

According to an embodiment of the present disclosure, the fluorine compound-containing layer 22A has the thickness of 3 nm or more and 200 nm or less. With the thickness of 3 nm or more, not only a water repellency, but also the more favorable abrasion resistance and antiweatherability can be more easily given in the fluorine compound-containing layer 22A. While on the other hand, with the thickness of 200 nm or less, the unintentional surface reflectance of light can be more easily suppressed, and thereby allowing the optical element to be more favorably transparent. The thickness of the fluorine compound-containing layer 22A is preferably 4 nm or more and 150 nm or less, more preferably 5 nm or more and 100 nm or less, for example 10 nm or more and 85 nm or less, or 15 nm or more and 60 nm or less.

As for the thickness of the fluorine compound-containing layer 22A in the optical element according to the present disclosure, the minimum thickness (i.e., base thickness of layer) may be approximately 3 nm, 4 nm or 5 nm. Even with such small thickness of the fluorine compound-containing layer, the optical element of the present disclosure may have the desired antiweatherability and abrasion resistance. Such minimum thickness of the fluorine compound-containing layer may also be approximately 15 nm, 20 nm or 25 nm. As the minimum thickness becomes larger, the effects of the abrasion resistance and antiweatherability can tend to be maintained for a longer period of time. As such, the minimum thickness of the fluorine compound-containing layer provided as the outermost surface part may be 3 nm or more and 25 nm or less, 4 nm or more and 20 nm or less, or 5 nm or more and 15 nm or less.

According to an embodiment of the present disclosure, as for the fluorine compound-containing layer provided with the bumps and dents of surface, an occupancy ratio of the bumps regarding the bumps and dents of surface with respect to the surface area of the whole fluorine compound-containing layer is 3% or more and 30% or less, for example 3% or more and 25% or less, or 3% or more and 20% or less. Such occupancy ratio of 3% or more can more sufficiently provide the thicker layer portions capable of preferentially deforming, and making it possible to more suitably prevent the wearing of the fluorine compound-containing layer. While on the other hand, the occupancy ratio of 30% or less, of 25% or less, or of 20% or less can more easily suppress the unintentional surface reflectance of light, and thereby allowing the optical element to be more favorably transparent.

The "occupancy ratio of the bumps regarding the bumps and dents of surface with respect to the surface area of the whole fluorine compound-containing layer" may be one calculated from an image took by the use of a light microscope (model MX50 manufactured by OLYMPUS Corporation), a reflectance analyzer (model USPM-RU manufactured by OLYMPUS Corporation) and/or a microscope (model VHX-5000 or the like manufactured by KEYENCE Corporation), the image being one for showing the surface of the fluorine compound-containing layer. For example, as for the image took by the above device(s), an image thresholding may be done to calculate the occupancy ratio of the bumps regarding the bumps and dents in the fluorine compound-containing layer. In such image, supposing that the whole surface area of the fluorine compound-containing layer is "$A_1$", and the area of the bumps is "$A_0$", the occupancy ratio of the bumps can be given as follows: Bump occupancy ratio (%)=($A_0/A_1$)×100. More specifically, an image took by a microscope VHX5000 (KEYENCE Corporation) with an optical magnification of 1000 times is subjected to an image thresholding by using a software called "VHX image editing soft" (KEYENCE Corporation) wherein a color extraction function is used to select the color of the bumps, and thereby providing a thresholding image (see FIG. 13). In this regard, the occupancy ratio of bumps (%) can be given on the software by calculating the ratio of the area of spotted portions corresponding to the bumps in the thresholding image.

In the present disclosure, the bumps and dents of surface may be provided by sequentially forming the fluorine compound-containing layer after the formation of the silicon oxide-containing layer through the discontinuous pressure condition with respect to the optical multi-layered part. In this regard, the formation of the fluorine compound-containing layer having the bumps and dents of surface can be more effectively facilitated by an adjustment of the amount of a fluorine compound to be charged into the vapor apparatus in the vacuum vapor method (e.g., by the adjustment of the volume of the charged fluorine compound, and/or the adjustment of a blended composition of the charged fluorine compound), and/or by the changing of irradiation amount with respect to the fluorine compound (e.g., the changing of the energy for evaporating the fluorine compound).

Figure 4:
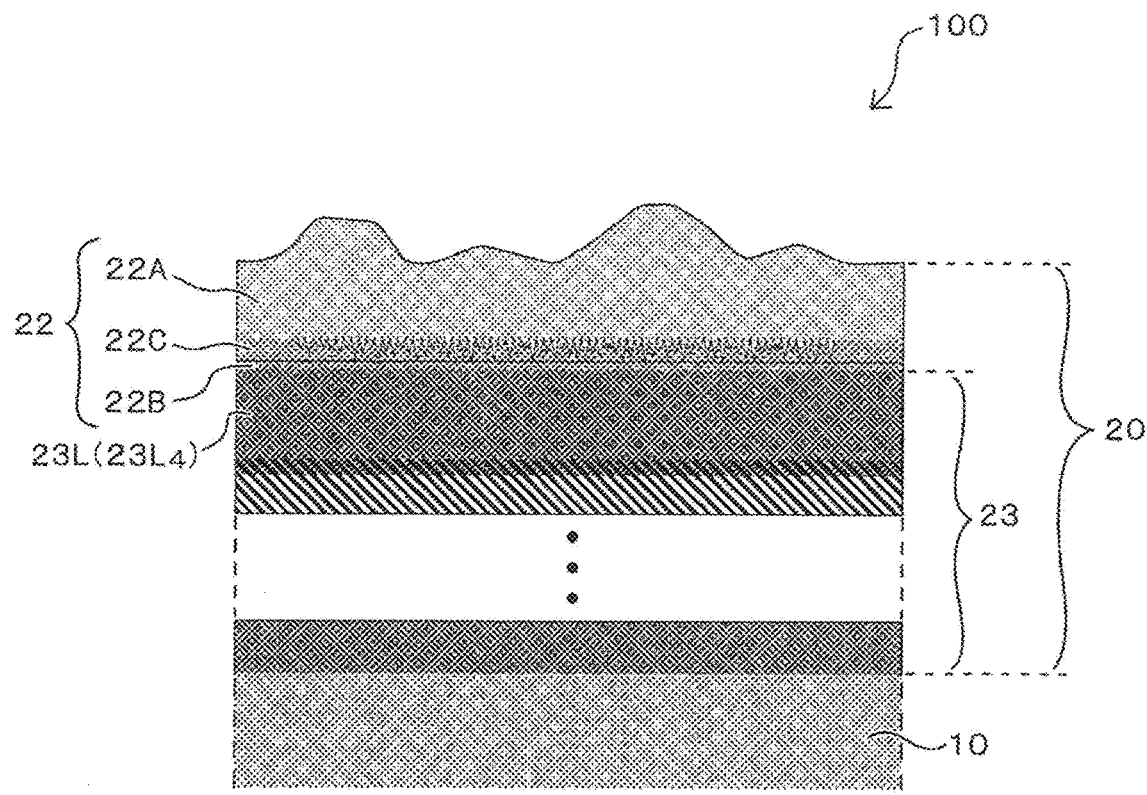
FIG. 4 is a schematic cross-sectional view mainly showing an outermost surface part of an optical element and also a vicinity thereof according to one embodiment of the present disclosure.

According to an embodiment of the present disclosure, a mixture layer 22C in which a fluorine compound and a silicon oxide are mixed to each other is provided between the fluorine compound-containing layer 22A and the silicon oxide-containing layer 22B (see FIG. 4). In other words, such three layers are sequentially provided as the outermost surface portion of the stack covering 20. The presence of the mixture layer 22C can more strengthen the adherence between the fluorine compound-containing layer 22A and the silicon oxide-containing layer 22B. This can facilitate a longer lasting of the light resistance in which a deterioration of optical characteristic can be suitably suppressed against ultraviolet light, visible light and/or infrared light, and can also facilitate a longer lasting of the abrasion resistance in which a resistance against the friction by the external factor can be given. For example, the thickness of the mixture layer 22C may be smaller than each of the fluorine compound-containing layer 22A and the silicon oxide-containing layer 22B. Namely, as a thin layer which is thinner than that of each of the fluorine compound-containing layer 22A and the silicon oxide-containing layer 22B, the mixture layer 22C may be interposed between the fluorine compound-containing layer 22A and the silicon oxide-containing layer 22B.

The silicon oxide-containing layer at least contains a silicon oxide therein, and may also contain a binder such as resin, and/or other compounds. From the standpoint of the high transparency and the easier adjustment of the refraction index, it is preferred that the silicon oxide-containing layer includes silicon dioxide ($SiO_2$). The thickness of the silicon oxide-containing layer 22B may be 100 nm or less. Such layer thickness of 100 nm or less facilitates the surface of the layer to be densified and smoother, and thereby facilitating providing the fluorine compound-containing layer 22A with the more favorable abrasion resistance, antiweatherability and water repellency. The thickness of the silicon oxide-containing layer 22B is preferably 50 nm or less, and for example 30 nm or less.

According to an embodiment of the present disclosure, the mixture layer 22C has the thickness of 0.5 nm or more and 5 nm or less. Such thickness of 0.5 nm or more regarding the mixture layer can particularly strengthen the adherence between the fluorine compound-containing layer 22A and the silicon oxide-containing layer 22B. While on the other hand, the thickness of 5 nm or less regarding the mixture layer can facilitate suppressing the unintentional surface reflectance of light, and thereby allowing the optical element to be favorably transparent. The "thickness of the mixture layer" in the present disclosure can be measured in a similar way to that of the maximum and minimum thicknesses of the bumps and dents as described above.

Examples of a fluorine compound in the fluorine compound-containing include, but are not particularly limited to, at least one selected from the group consisting of methyl trifluoroacetate, ethyl perfluoropropionate, ethyl perfluorooctanoate, perfluoroalkyl ether, 2,2,2-trifluoroethyl difluoromethyl ether, 1,1,2,2-tetrafluoroethyl ethyl ether, hexafluoroisopropylmethyl ether, 1H, 1H-tri decafluoroheptylamine, perfluorohexyliodide, perfluorohexylethylene, chlorotrifluoroethylene, fluoroalkyl ether, 3-perfluorohexyl-1,2-epoxypropane, perfluoropropionic acid, perfluoroheptanic acid, 2-(perfluorobutyl)ethyl acrylate, 2-(perfluperfluoro-4-ethoxybutane, orohexyl)ethyl acrylate, 1H,1H-heptafluorobutanol, fluoropolyether, 2-(perfluorobutyl)ethanol, perfluorohexane, perfluorocyclobutane, perfluorooctane, perfluorodecane, perfluoromethylcyclohexane, perfluoro-1,3-dimethyl cyclohexane, perfluoro-4-methoxybutane, perfluoro-4-ethoxybutane, metaxylene hexafluorolide, 6-(perfluorobutyl)hexanol, and 2-(perfluorooctyl)ethanol.

According to an embodiment of the present disclosure, the fluorine compound comprises a perfluoroalkyl ether group. For example, the number of carbon contained in the perfluoroalkyl ether group may be 1 or more and 10 or less. For example, the perfluoroalkyl ether group may be —$(C_4F_8O)_a(C_3F_6O)_b$—$(C_2F_4O)_c$—$(CF_2O)_d$— wherein a, b, c and d are independently an integer of 0-90, the sum of a, b, c and d may be at least 1, and a repeat unit inside the parentheses regarding each of a, b, c and d may have any type of sequential order. Moreover, a compound having the perfluoroalkyl ether group may have any type of element or group at its terminal. Such perfluoroalkyl ether group of the fluorine compound facilitates the fluorine compound-containing layer to have the more favorable ductility, and thereby facilitating providing the more favorable abrasion resistance. The more favorable antiweatherability (light resistance in particular) can also be easily given.

According to an embodiment of the present disclosure, the fluorine compound in the fluorine compound-containing layer comprises the perfluoroalkyl ether group having a straight-chain structure with its structural unit of $C_3F_6O$. The structural unit of $C_3F_6O$ may be repeated at least twice in the fluorine compound. For example, the repeat number of the structural unit of $C_3F_6O$ is 5 or more and 10 or less. When the fluorine compound comprises the perfluoroalkyl ether group having the straight-chain structure with its structural unit of $C_3F_6O$, the favorable ductility of the fluorine compound-containing layer may be facilitated to be given. The $C_3F_6O$ in the perfluoroalkyl ether group may have the straight-chain structure only, which means such $C_3F_6O$ may have no branched-chain structure.

The perfluoroalkyl ether group in the fluorine compound-containing layer can be identified by a compositional analysis with use of nuclear magnetic resonance (NMR) spectroscopy (model NMR SPECTROMETER manufactured by JEOL Ltd.) or TOF-SIMS (model TOF-SIMS5 manufactured by ION-TOF Company).

According to an embodiment of the present disclosure, a weight-average molecular weight of the fluorine compound is 1000 or more and 20000 or less. Such weight-average molecular weight of 1000 or more can more effectively provide the lower frictional properties and the water repellency. While on the other hand, the weight-average molecular weight of 20000 or less can particularly facilitate strengthening an adherence between the fluorine compound-containing layer and the layer of the stack covering. The weight-average molecular weight of the fluorine compound may be 2000 or more and 10000 or less. The weight-average molecular weight of the fluorine compound may refer to one measured by a gel permeation chromatography (GPC) (model HLC8120GPC manufactured by Tosoh Corporation).

According to an embodiment of the present disclosure, the fluorine compound-containing layer may comprise a silicon. The silicon in the fluorine compound-containing layer can facilitate providing the more favorable adherence of the fluorine compound-containing layer with respect to the silicon oxide-containing layer in a case where they are adjacent to each other.

According to an embodiment of the present disclosure, the thickness of the stack covering 20 in the optical element is 350 nm or more and 1000 nm or less (see FIG. 1). Such thickness of 350 nm or more can facilitate providing the more favorable abrasion resistance against the physical contact (e.g., hitting of sand dust), and thereby facilitating providing a favorable durability against a corrosion fatigue (e.g., acid rain, salt damage etc.). While on the other hand, the thickness of 1000 nm or less allows the whole thickness of the optical element to be thinned.

According to an embodiment of the present disclosure, the optical multi-layered part of the stack covering has the alternate stacking of a high refractive index layer having a relatively high refractive index and a low refractive index layer having a relatively low refractive index. Such stacking in the optical multi-layered part makes it possible to facilitate suppressing a light reflection of an unintended wavelength at the surface of the optical element. Accordingly, when the optical element of the present disclosure is used as an optical lens for a camera, a lens for an optical sensor, and the like, the desired characteristic features of the lens (for example, transparency, sensor accuracy, etc.) can be more easily ensured.

As for the illustrated embodiment of the optical element 100 shown in FIG. 1, the optical multi-layered part 23 of the stack covering 20 is located in contact with both of the base material 10 and the silicon oxide-containing layer 22B of the outermost surface part 22. Namely, the optical element 100 illustrated in FIG. 1 is composed at least of the base material 10 and the stack covering 20, in which case the stack covering 20 is composed of the optical multi-layered part 23, and also the silicon oxide-containing layer 22B and the fluorine compound-containing layer 22A both of which are provided on the optical multi-layered part through the discontinuous pressure condition with respect to the optical multi-layered part.

In the optical multi-layered part 23, a surface reflection of visible light in a wavelength region of approximately 380 nm or more and 780 nm or less can be more easily canceled by the presence of the alternate stacking of the high refractive index layer 23H and the low refractive index layer 23L (see FIG. 1). In the optical multi-layered part 23, the high refractive index layer 23H and the low refractive index layer 23L may be alternately stacked on each other such that the optical multi-layered part 23 has four layers or more and fifteen layers or less, for example. More specifically, the number of the stacked layers may be 4 or more and 10 or less, 4 or more and 8 or less, or 4 or more and 7 or less. The stacked layers as 4 or more layers make it possible to more effectively give the desired optical characteristic features. While on the other hand, when the number of the layers stacked is 15 or less, the reduced thickness of the optical element as a whole can be provided. As one example, the optical multi-layered part 23 is provided as a whole such that the high refractive index layer 23H and the low refractive index layer 23L are alternately stacked as the seven stacked layers. In this regard, the fluorine compound-containing layer 22A and the silicon oxide-containing layer 22B may have an antireflection function, similarly to that of the optical multi-layered part 23.

According to an embodiment of the present disclosure, the thickness of the optical multi-layered part 23 in the optical element is 350 nm or more. Such thickness of 350 nm or more can facilitate giving the desired optical characteristics more effectively. Moreover, the thickness of 350 nm or more can facilitate providing the more favorable abrasion resistance against the physical contact, and thereby facilitating giving the favorable durability against the corrosion fatigue.

According to an embodiment of the present disclosure, a material of the high refractive index layer 23H can be at least one selected from the group consisting of oxides of titanium (Ti), zirconium (Zr), hafnium (Hf) tantalum (Ta) and/or lanthanum (La), and mixture of such oxides. From the viewpoint of layer capable of having a higher hardness and a higher smoothness, and also layer having a higher resistance to environment test, a Ti/La complex oxide may be used wherein the layer contains titanium and lanthanum. From the viewpoint of suppressing the surface reflection of light having the visible wavelength region, the refractive index of the high refractive index layer 23H may be 1.80 or more and 2.30 or less.

The low refractive index layer 23L may comprise a silicon oxide and/or a magnesium fluoride, and also may comprise a binder such as a resin material. From the viewpoint of the higher transparency and the easier adjustment of the refractive index, and also another viewpoint of the adherence with respect to the silicon oxide-containing layer, the low refractive index layer 23L may contain a silicon dioxide ($SiO_2$). The low refractive index layer 23L may also have the same composition as that of the silicon oxide-containing layer 22B. From the viewpoint of suppressing the surface reflection of light having the visible wavelength region, the refractive index of the low refractive index layer 23L may be 1.20 or more and 1.80 or less.

The material for the base material is, but not particularly limited to, at least one selected from the group consisting of glass, resin, metal and ceramics. According to an embodiment of the present disclosure, the base material made of the glass material facilitates the optical element to be higher transparent, and also facilitates a stronger adherence of the base material with respect to the stack covering.

In the optical element of the present disclosure, it is preferred that the optical multi-layered part 23 and the outermost surface part 22 are provided through the discontinuous steps with each other. In particular, it is preferred that the optical multi-layered part 23, and the outermost surface part 22 having the fluorine compound-containing layer 22A and the silicon oxide-containing layer 22B are formed by the discontinuous pressure condition therebetween. In other words, the stack covering may be provided such that the optical multi-layered part is disposed and thereafter the silicon oxide-containing layer and the fluorine compound-containing layer are disposed as the outermost surface part 22 through the reset pressure condition. This facilitates a formation of more distinct interface/boundary between the optical multi-layered part and the outermost surface part in the stack covering. For example, in the cross-sectional image of the optical element, the visible interface can be provided between the optical multi-layered part and the outermost surface part.

Figure 5:
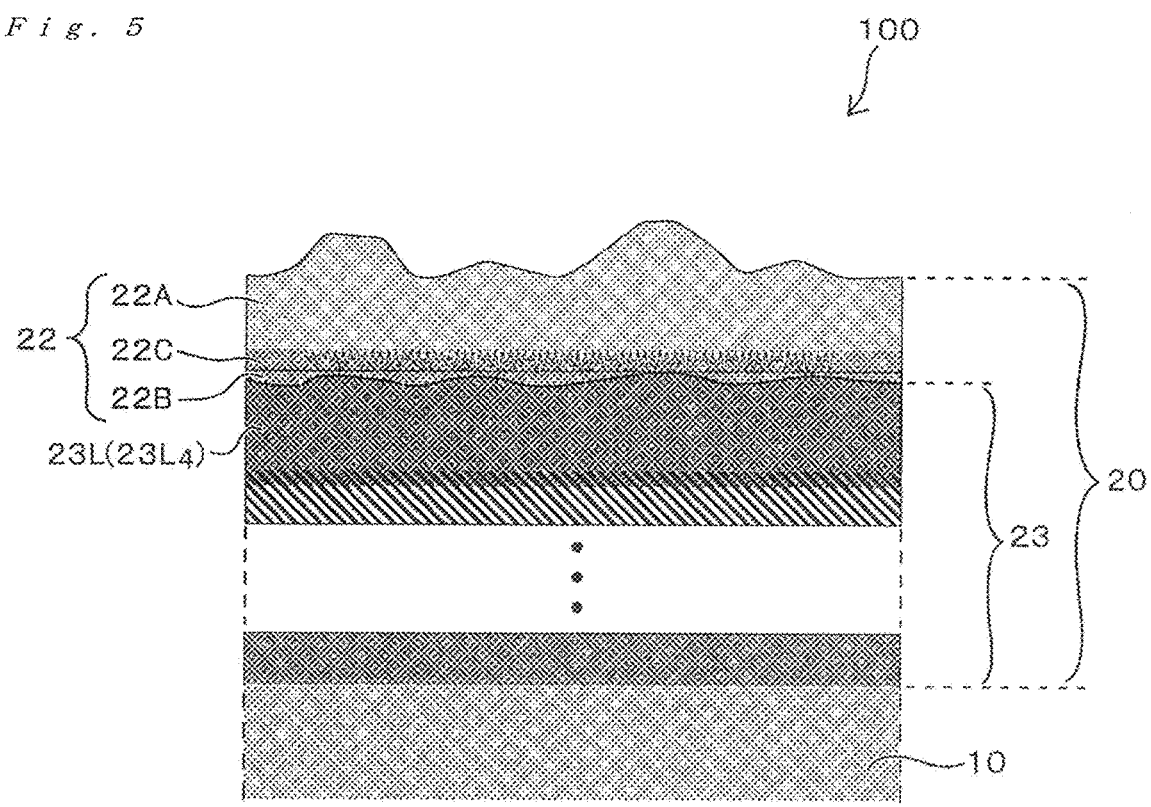
FIG. 5 is a schematic cross-sectional view mainly showing an outermost surface part of an optical element (the optical element of Example 1 in particular) and also a vicinity thereof according to one embodiment of the present disclosure.

As for the provision of the optical multi-layered part, a plurality of the layers are sequentially formed. As the sequential forming of the layers proceeds for the provision of the optical multi-layered part, there may be the case where the surface thereof undesirably becomes rougher. In particular, due to the crystal grain that may be formed in each layer, the surface of the resultant optical multi-layered part 23 may become rougher, which means that the roughness of the surface may become higher. Just as an example, the surface roughness of the optical multi-layered part 23 having the rough surface may be given as "Ra >5 nm". Thus, when the outermost surface part 22 is provided on such optical multi-layered part 23 through the discontinuous step, the interface between the optical multi-layered part 23 and the outermost surface part 22 can be formed as "uneven or non-linear interface" in the cross-sectional view (see FIG. 5).

According to an embodiment of the present disclosure, the low refractive index layer $23L_4$, which is the outermost surface layer of the optical multi-layered part 23, has the same composition of that of the silicon oxide-containing layer 22B of the outermost surface part 22. Between the low refractive index layer $23L_4$ and the silicon oxide-containing layer 22B, the discontinuous pressure condition may be intervened. Thus, according to this embodiment, the visible interface can be provided between the low refractive index layer $23L_4$ serving as the outermost layer in the optical multi-layered part 23 and the silicon oxide-containing layer 22B serving as an undermost layer in the outermost surface part 22. In some embodiments, due to the surface roughness of the outermost layer of the optical multi-layered part 23, the uneven or non-linear interface (or a corrugated interface) can be seen between the optical multi-layered part 23 and the outermost surface part 22 in the cross-sectional view.

In a case where the silicon oxide-containing layer 22B of the outermost surface part 22 corresponds to the "additional silicon oxide-containing layer", it is preferred that the thickness of the silicon oxide-containing layer 22B is smaller than that of the outermost surface layer of the optical multi-layered part 23. For example, when the outermost surface layer of the optical multi-layered part 23 corresponds to the above-mentioned low refractive index layer $23L_4$ (i.e., the low refractive index layer of the optical multi-layered part), the thickness of the silicon oxide-containing layer 22B of the outermost surface part 22 may be smaller than the thickness of the silicon oxide-containing layer of the optical multi-layered part 23.

Figure 6A:
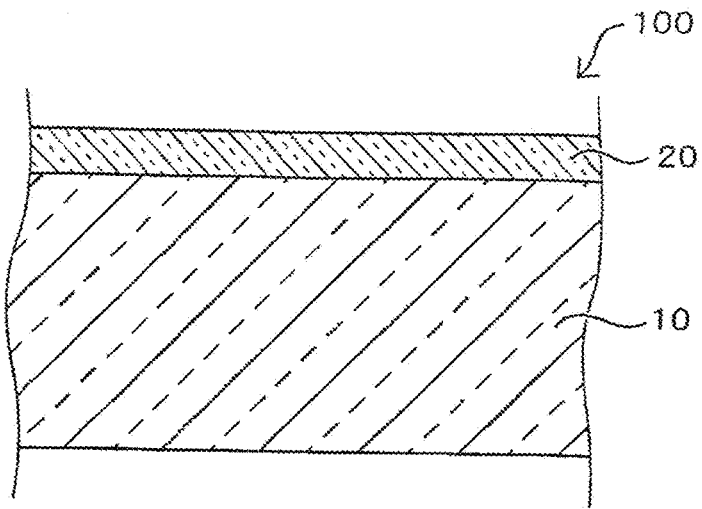
FIGS. 6A to 6C are cross-sectional views schematically showing various embodiments of an optical element according to the present disclosure.
Figure 6B:
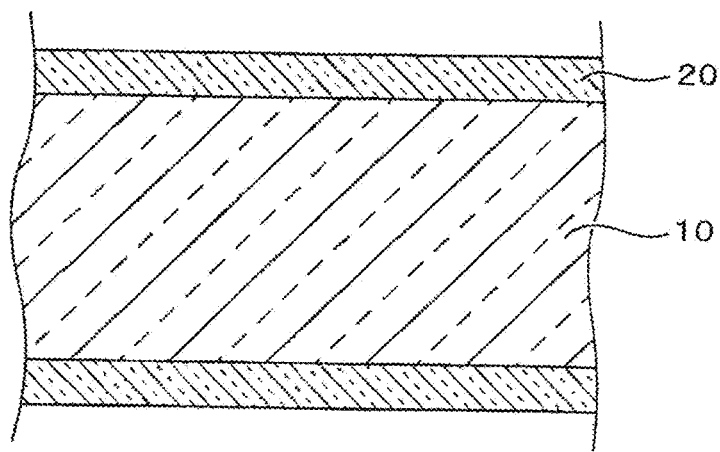
Figure 6C:
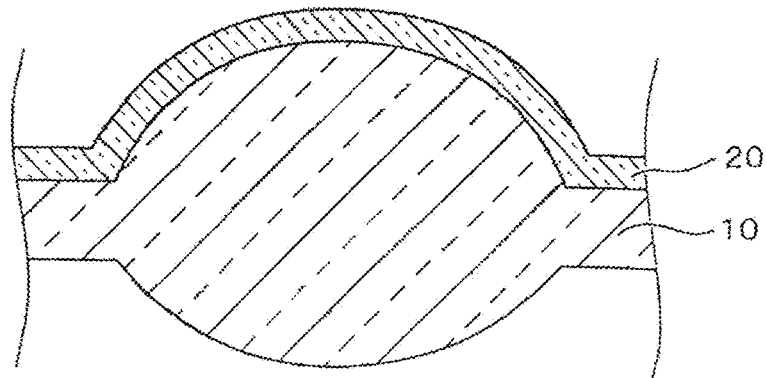

The whole surface form of the optical element 100 may be either a flat surface as shown in FIGS. 6A and 6B, or a curved surface as if the optical element provides a lens as shown in FIG. 6C. In the optical element 100, the stack covering 20 may be provided onto only one of the surfaces of the base material 10 (see FIG. 6A). Alternatively, the stack covering 20 may be provided onto both of the two opposing surfaces of the base material 10 (see FIG. 6B).

The optical element 100 may be shaped to have a shape suitable for its application. For example, the whole shape of the optical element 100 is a plate-like shape that is suitable for an optical filter, or an infrared transmission window, etc. While on the other hand, the shape of the optical element 100 is, for example, a concave-convex shape (e.g., biconcave shape, biconvex shape, etc.) that is suitable for a lens for imaging applications. In order to shape a material into a form of the optical element 100, any suitable processes may be employed, such as a grinding/polishing and/or a press molding.

In a case where the optical element is a lens, it may be formed from a material through a mold-press molding, for example. Such molding method will be described as an example. First, the material is pre-shaped into a substantially final shape in advance by an injection molding. Next, the pre-shaped material is put into a cavity of a mold for forming optical element, the mold having been heated at or above a deflection temperature under load and below a glass transition temperature regarding the material. Thereafter, when the temperature of the material becomes substantially the same as that of the mold for forming optical element and thus becomes equal to or higher than the deflection temperature under load and also becomes less than the glass transition temperature, the material is pressed by lowing a press head while the material is deformed thereby. Thereafter, the pressing force is released, and the temperature is cooled to the deflection temperature under load to take the shaped optical element from the mold. This can be obtained an optical element having the desired shape (e.g., a lens shape).

The optical element 100 according to the present disclosure may be a lens capable of at least transmitting visible light. The optical element may be used as an imaging lens or the like in the field of exterior purposes. For example, the optical element according to the present disclosure may be a lens to be used for cameras in a surveillance system for disaster prevention/crime prevention, and/or used for vehicle-mounted view cameras.

EXAMPLES

Hereinafter, the present disclosure will be described with reference to some examples, but the present disclosure is not particularly limited to these examples.

Example 1

A glass lens substrate (refractive index: about 1.825) as a base material 10 was subjected to an ultrasonic cleaning by immersing it in a weakly alkaline cleaner for glass. Subsequent to the ultrasonic cleaning, the glass lens substrate was rinsed with pure water, and thereafter it was dried under the temperature of 130° C. for 60 minutes. See FIG. 1. Then, an optical multi-layered part 23 was formed on one of the surfaces of the base material 10. Specifically, low refractive index layers 23L (i.e., $23L_1$, $23L_2$, $23L_3$ and $23L_4$) and high refractive index layers 23H (i.e., $23H_1$, $23H_2$, $23H_3$) were alternately formed in a stacked form of seven layers by a vapor deposition with a set temperature for the substrate 10 of about 300° C. and an introduction of an oxygen gas in a vapor deposition apparatus. Lanthanum titanate was used as a material for the high refractive index layers 23H. Silicon dioxide was used as a material for the low refractive index layers 23L. The refractive index of each layer was adjusted within a range shown in Table 1 in order to give a desired antireflection function for the optical element. After the formation of the optical multi-layered part 23, an ion-assist deposition apparatus was used in order to once sever the vacuum-low pressure condition of the vapor deposition and made the pressure condition discontinuous. In the ion-assist vapor deposition apparatus, a silicon oxide-containing layer 22B, and a fluorine compound-containing layer 22A having a perfluoro alkyl ether group were sequentially formed on the surface of the optical multi-layered part 23 (i.e., sequentially formed on the low refractive index layers $23L_4$). As a result, there was finally obtained an optical element 100 (see FIG. 1). As for the formation of the fluorine compound-containing layer 22A, the charged amount of a fluorine compound in the deposition apparatus was 10 μL as a volume. Between the silicon oxide-containing layer 22B and the fluorine compound-containing layer 22A, a mixture layer 22C was formed (see FIG. 5). In a cross-sectional image, the visible interface (particularly, uneven or non-linear visible interface in the cross-sectional view) was provided between the low refractive index layer $23L_4$ and the silicon oxide-containing layer 22B. The physical property values of the respective layers are shown in Table 1. The refractive indices in Table 1 are ones measured at wavelength of 500 nm.

TABLE 1

| Layer | | Material | Refractive index [—] | Layer thickness [nm] |
|---|---|---|---|---|
| Base material | | Glass material | 1.50-2.00 | — |
| Optical multi-layered part | $23L_1$ | Silicon dioxide | 1.33-1.72 | 30 |
| | $23H_1$ | Lanthanum titanate | 1.78-2.20 | 15 |
| | $23L_2$ | Silicon dioxide | 1.33-1.72 | 75 |
| | $23H_2$ | Lanthanum titanate | 1.78-2.20 | 15 |
| | $23L_3$ | Silicon dioxide | 1.33-1.72 | 45 |
| | $23H_3$ | Lanthanum titanate | 1.78-2.20 | 125 |
| | $23L_4$ | Silicon dioxide | 1.33-1.72 | 60 |
| Discontinuous pressure condition | | | | |
| Outermost surface part | 22B | Silicon dioxide | 1.33-1.72 | 15 |
| | 22C | Silicon dioxide/ Perfluoroalkyl ether | 1.27-1.56 | 0.5-5 |
| | 22A | Perfluoroalkyl ether | 1.22-1.40 | 15-100 |

Example 2

A glass lens substrate (refractive index: about 1.825) as a base material 10 was subjected to an ultrasonic cleaning by immersing it in a weakly alkaline cleaner for glass. Subsequent to the ultrasonic cleaning, the glass lens substrate was rinsed with pure water, and thereafter it was dried under the temperature of 130° C. for 60 minutes. See FIG. 1. Then, an optical multi-layered part 23 was formed on one of the surfaces of the base material 10. Specifically, low refractive index layers 23L (i.e., $23L_1$, $23L_2$, $23L_3$ and $23L_4$) and high refractive index layers 23H (i.e., $23H_1$, $23H_2$, $23H_3$) were alternately formed in a stacked form of seven layers by a vapor deposition with a set temperature for the substrate 10 of about 300° C. and an introduction of an oxygen gas in a vapor deposition apparatus. Lanthanum titanate was used as a material for the high refractive index layers 23H. Silicon dioxide was used as a material for the low refractive index layers 23L. The refractive index of each layer was adjusted within a range shown in Table 2 in order to give a desired antireflection function for the optical element. After the formation of the optical multi-layered part 23, an ion-assist vapor deposition apparatus was used in order to once sever the vacuum-low pressure condition of the vapor deposition and made the pressure condition discontinuous. In the ion-assist deposition apparatus, a silicon oxide-containing layer 22B, and a fluorine compound-containing layer 22A having a perfluoro alkyl ether group were sequentially formed on the surface of the optical multi-layered part 23 (i.e., sequentially formed on the low refractive index layers $23L_4$). As a result, there was finally obtained an optical element 100 (see FIG. 1). As for the formation of the fluorine compound-containing layer 22A, the charged amount of a fluorine compound in the deposition apparatus was 3.5 μL as a volume. Between the silicon oxide-containing layer 22B and the fluorine compound-containing layer 22A, a mixture layer 22C was formed (see FIG. 5). In a cross-sectional image, the interface (particularly, uneven or non-linear interface in the cross-sectional view) was formed between the low refractive index layer $23L_4$ and the silicon oxide-containing layer 22B. The physical property values of the respective layers are shown in Table 2. The refractive indices in Table 1 are ones measured at wavelength of 500 nm.

TABLE 2

| Layer | | Material | Refractive index [—] | Layer thickness [nm] |
|---|---|---|---|---|
| Base material | | Glass material | 1.50-2.00 | — |
| Optical multi-layered part | $23L_1$ | Silicon dioxide | 1.33-1.72 | 30 |
| | $23H_1$ | Lanthanum titanate | 1.78-2.20 | 15 |
| | $23L_2$ | Silicon dioxide | 1.33-1.72 | 75 |
| | $23H_2$ | Lanthanum titanate | 1.78-2.20 | 15 |
| | $23L_3$ | Silicon dioxide | 1.33-1.72 | 45 |
| | $23H_3$ | Lanthanum titanate | 1.78-2.20 | 125 |
| | $23L_4$ | Silicon dioxide | 1.33-1.72 | 60 |
| Discontinuous pressure condition | | | | |
| Outermost surface part | 22B | Silicon dioxide | 1.33-1.72 | 15 |
| | 22C | Silicon dioxide/ Perfluoroalkyl ether | 1.27-1.56 | 2 |
| | 22A | Perfluoroalkyl ether | 1.22-1.40 | 5-10 |

Comparative Example 1

A glass lens substrate (refractive index: about 1.825) as a base material was subjected to an ultrasonic cleaning by immersing it in a weakly alkaline cleaner for glass. Subsequent to the ultrasonic cleaning, the glass lens substrate was rinsed with pure water, and thereafter it was dried under the temperature of 130° C. for 60 minutes. Then, an optical multi-layered part was formed on one of the surfaces of the base material. Specifically, low refractive index layers (i.e., $23L_2'$, $23L_3'$ and $23L_4'$) and high refractive index layers (i.e., $23H_1'$, $23H_2'$, $23H_3'$) were alternately formed in a stacked form of seven layers by a vapor deposition with a set temperature for the substrate of about 300° C. and an introduction of an oxygen gas in a vapor deposition apparatus. Lanthanum titanate was used as a material for the high refractive index layers. Silicon dioxide was used as a material for the low refractive index layers. The refractive index of each layer was adjusted within a range shown in Table 3 in order to give a desired antireflection function for the optical element. After the formation of the optical multi-layered part, the same deposition apparatus was used to form a fluorine compound-containing layer 22' having a perfluoro alkyl ether group with no setting of heat. As a result, there was finally obtained an optical element. As for the formation of the fluorine compound-containing layer, the charged amount of fluorine compound in the deposition apparatus was 10 μL as a volume. The physical property values of the respective layers are shown in Table 3. The refractive indices in Table 3 are ones measured at wavelength of 500 nm.

TABLE 3

| Layer | Material | Refractive index [—] | Layer thickness [nm] |
|---|---|---|---|
| Base material | Glass material | 1.50-2.00 | — |
| 23L$_1$' | Silicon dioxide | 1.33-1.72 | 30 |
| 23H$_1$' | Lanthanum titanate | 1.78-2.20 | 15 |
| 23L$_2$' | Silicon dioxide | 1.33-1.72 | 75 |
| 23H$_2$' | Lanthanum titanate | 1.78-2.20 | 15 |
| 23L$_3$' | Silicon dioxide | 1.33-1.72 | 45 |
| 23H$_3$' | Lanthanum titanate | 1.78-2.20 | 125 |
| 23L$_4$' | Silicon dioxide | 1.33-1.72 | 75 |
| 22' | Perfluoroalkyl ether | 1.22-1.40 | 10-50 |

(Comparison Between Example 1 and Comparative Example 1)

As for Example 1 and Comparative example 1, experiments on "Abrasion resistance test" and "Antiweatherability test" were conducted.

(Abrasion Resistance Test)

By a method in accordance with JIS Standard (JIS K 5600-5-10), the abrasion resistance of the optical element was evaluated using steel wool (SW). Specifically, the steel wool #0000 (manufactured by BONSTAR) was put on the surface of the stack covering of the optical element. Then, the steel wool applied under the load of 1 kg/cm$^2$ was reciprocally moved to conduct a scuff test. The reciprocal movement of the steel wool was done 3000 times under the condition of a moving velocity of 80 mm/sec and a moving distance of ±10 mm.

(Antiweatherability Test)

By a method in accordance with JIS Standard (JIS B 7754), the evaluation of the antiweatherability of the optical element was carried out by evaluating the resistance of the optical element against the degradation attributed to a surrounding environment. In particular, the resistance of the light element in terms of the light resistance was evaluated. Specifically, the surface of the stack covering of the optical element was subjected to an alternation of an irradiation for 4 hours and a darkness-moistening for 4 hours in a total of 500 hours, using an ultraviolet fluorescence light under the condition of an irradiance of 30 W/m$^2$ (irradiation wavelength: 313 nm) and a black panel temperature of 63° C.

Figure 7:
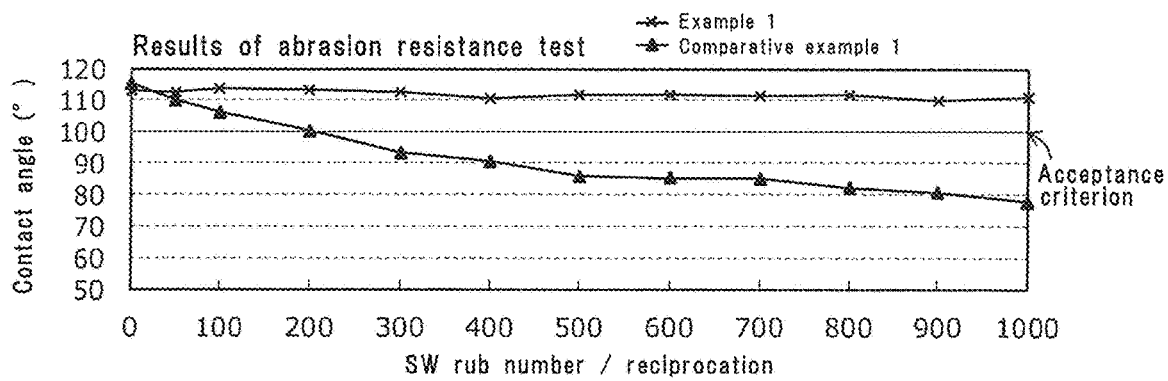
FIG. 7 is a graph showing the results of abrasion resistance test regarding Example 1 and Comparative example 1.
Figure 8:
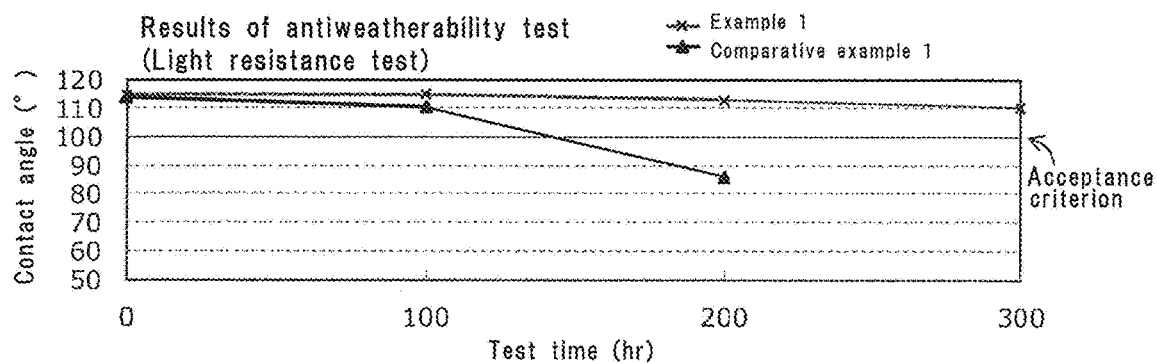
FIG. 8 is a graph showing the results of antiweatherability test regarding Example 1 and Comparative example 1.

The results are shown in FIGS. 7 and 8. As for the evaluation parameter of vertical axis in graphs of FIGS. 7 and 8, see "Contact Angle" described later. The graphs in FIGS. 7 and 8 can indicate that the more improved antiweatherability and abrasion resistance were able to be both given in the optical element having the fluorine compound-containing layer and the silicon oxide-containing layer formed through the discontinuous pressure condition with respect to the optical multi-layered part.

(Comparison between Examples 1 and 2)

The tests of "Abrasion Resistance Test" and "Antiweatherability Test" were similarly conducted for the optical element of Example 2. Examples 1 and 2 have difference in their thickness of the fluorine compound-containing layer provided as the outermost surface part. Specifically, the minimum thickness of the fluorine compound-containing layer in Example 1 was about 15 nm, and whereas the minimum thickness of the fluorine compound-containing layer in Example 2 was about 5 nm.

Figure 9:
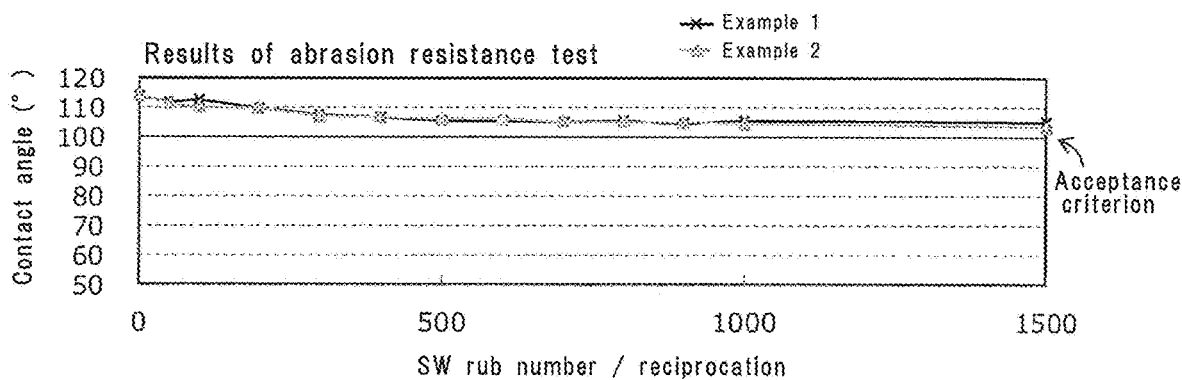
FIG. 9 is a graph showing the results of abrasion resistance test regarding Example 1 and Example 2.
Figure 10:
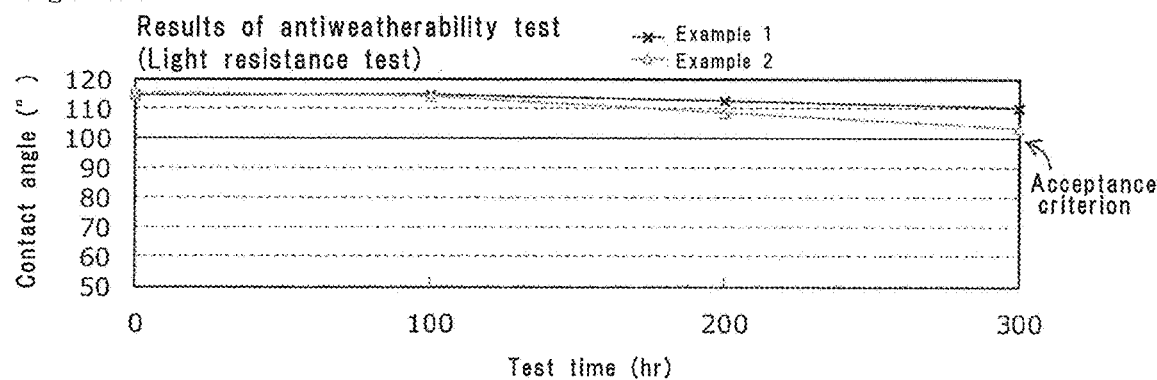
FIG. 10 is a graph showing the results of antiweatherability test regarding Example 1 and Example 2.

The results are shown in FIGS. 9 and 10. Even in the case of the thinner fluorine compound-containing layer, the graphs in FIGS. 9 and 10 can indicate that the more improved antiweatherability and abrasion resistance were able to be both maintained in the optical element having the fluorine compound-containing layer and the silicon oxide-containing layer formed through the discontinuous pressure condition with respect to the optical multi-layered part. Moreover, as can be seen from the graphs of FIGS. 9 and 10, the optical element with its thicker fluorine compound-containing layer tended to keep the improved abrasion resistance and antiweatherability for a longer period of time.

[Cross-Sectional Analysis of Fluorine Compound-Containing Layer by TEM]

Figure 11:
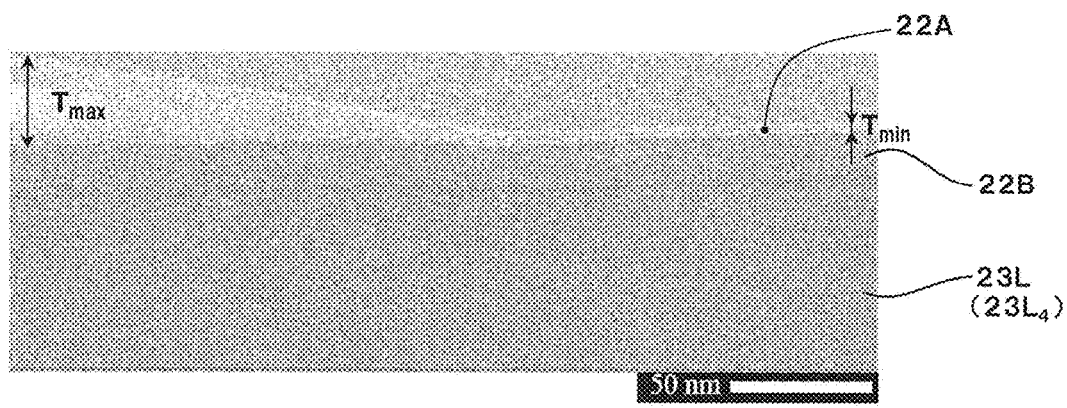
FIG. 11 is a cross-sectional TEM image of an optical element, the image being taken by a transmission electron microscope (TEM) at a magnification of 500000 times.

Analysis for the cross section of the fluorine compound-containing layer was performed using a transmission electron microscope, i.e., TEM. First, a cross-sectional cutout section of the optical element of Example 1 was produced by a focused ion beam device (model FB2200 manufactured by Hitachi, Ltd.) with an acceleration voltage of 10 to 40 KV. Next, a TEM image of the cross-sectional view regarding the fluorine compound-containing layer 22A and its vicinity was taken using the transmission electron microscope (TEM) (model JEM-2800 manufactured by JEOL Ltd.) with an acceleration voltage of 200 KV and a magnification of 500000 times (see FIG. 11). Based on the TEM image, the maximum layer thickness ($T_{max}$) and minimum layer thickness ($T_{min}$) regarding the bumps and dents of the surface in the fluorine compound-containing layer 22A were measured respectively. As a result, the maximum layer thickness ($T_{max}$) and minimum layer thickness ($T_{min}$) regarding the bumps and dents of the fluorine compound-containing layer 22A were 30.1 nm and 5.1 nm respectively, and thus "$T_{max}-T_{rain}$" was 25.0 nm. This measurement indicated that the thickness difference in the bumps and dents of surface of the fluorine compound-containing layer 22A was 10 nm or more and 80 nm or less. This measurement also indicated that the fluorine compound-containing layer 22A had the thicker layer portions which were thicker than the thinner layer portions thereof by the range of 10 nm or more and 80 nm or less.

Figure 12:
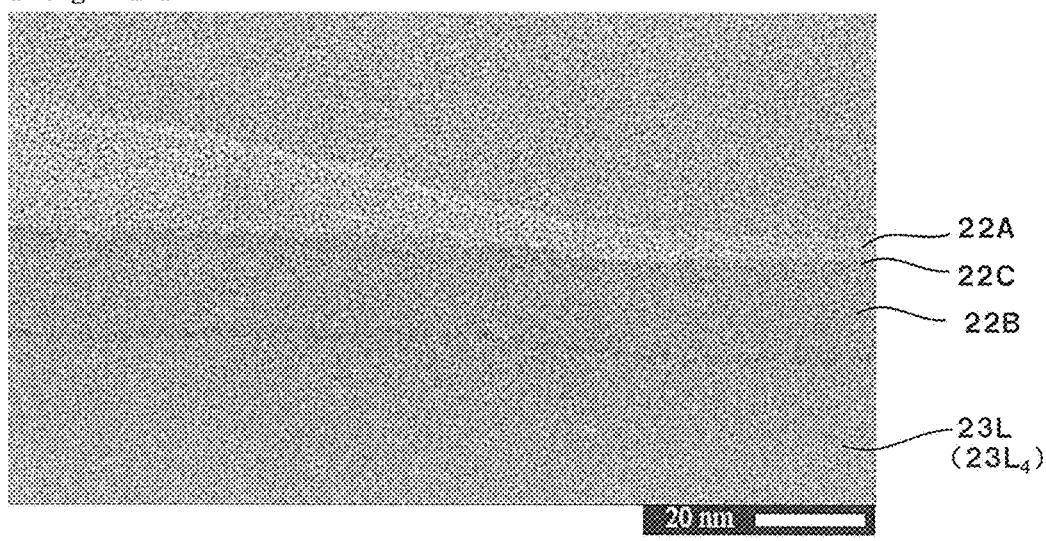
FIG. 12 is a cross-sectional TEM image of an optical element, the image being taken by a transmission electron microscope (TEM) at a magnification of 1000000 times.

Similarly, the TEM image of the cross-sectional view regarding the fluorine compound-containing layer 22A was taken using the transmission electron microscope (TEM) with the magnification of 1000000 times. See FIG. 12. The image showed that the optical element had the mixture layer 22C whose thickness was 0.5 nm or more and 5 nm or less (see Table 1). From the image, it was indicated that an interface (uneven or non-linear interface in particular) was formed between the low refractive index layer 23L$_4$ and the silicon oxide-containing layer 22B.

[Surface Analysis of Fluorine Compound-Containing Layer by Light Microscope]

Figure 13:
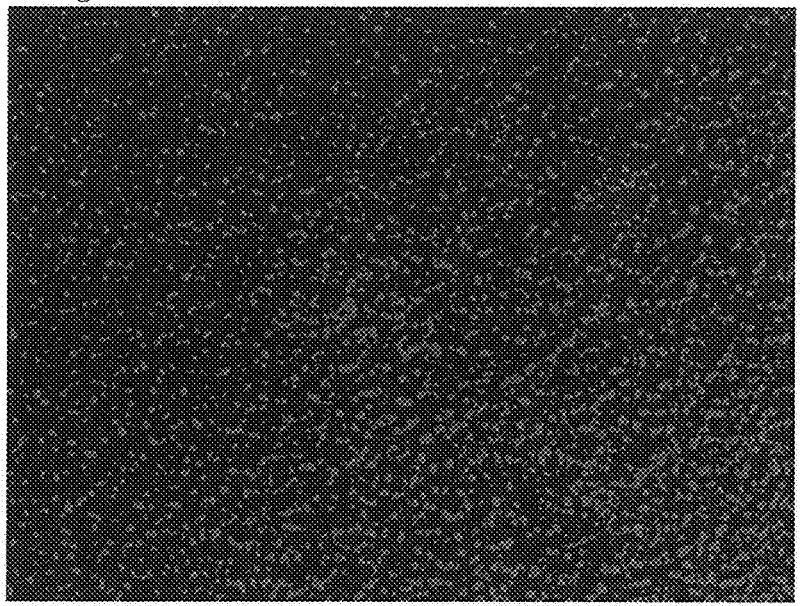
FIG. 13 is a surface image of an optical element in Example 1 according to the present disclosure, the image being taken by a light microscope.

Analysis for the surface region of each fluorine compound-containing layer of the optical elements was performed using a light microscope. An image thresholding regarding the surface of the fluorine compound-containing layer in each of Examples 1 and 2 as well as Comparative example 1 was conducted with a reflectance analyzer (model USPM-RU manufactured by OLYMPUS Corporation) and a microscope (model VHX-5000 manufactured by KEYENCE Corporation) with a magnification of 1000 times. As the representation, the thresholded image of Example 1 is shown in FIG. 13. In such thresholded image, an occupancy ratio of the bumps regarding the bumps and dents of surface in the fluorine compound-containing layer was calculated. Specifically, a ratio (%) of the area "$A_0$" of the bumps with respect to the whole surface area "$A_1$" of the fluorine compound-containing layer 22A was calculated, wherein the area of the spotted regions of the relatively light/pale in color was calculated in the image including the relatively dark colored regions as well as such relatively light/pale colored regions. The area "$A_1$" was 74347 μm$^2$, and whereas the area "$A_0$" for Example 1, Example 2 and Comparative example 1 were 12207 µm², 2410 ↑m², 20519 µm² respectively.

As a result, the occupancy ratio of the bumps regarding the bumps and dents of surface in the fluorine compound-containing layer were as follows:
Example 1: 16.4%
Example 2: 3.2%
Comparative example 1: 27.6%

Considering the results of "Abrasion Resistance Test" and "Antiweatherability Test" altogether, the optical element with the occupancy ratio of the bumps regarding the bumps and dents of surface in the fluorine compound-containing layer thereof being 3% or more and 20% or less tended to have both the improved abrasion resistance and antiweatherability.

[Structural Analysis of Fluorine Compound-Containing Layer by TOF-SIMS]

By a time-of-flight secondary ion mass spectrometry TOF-SIMS (Model TOF-SIMS5 manufactured by ION-TOF Company), a spectral intensity ratio regarding ion derived from the fluoro alkyl ether with respect to all the polymer in the surface of the fluorine compound-containing layer 22A of Example 1 was determined. The resulting spectral intensity ratio as well as cycle indicated that the fluorine compound-containing layer had the perfluoroalkyl ether group having a straight-chain structure with its structural unit of $C_3F_6O$.

Furthermore, in addition to "Abrasion Resistance Test" and "Antiweatherability Test", the following tests were conducted for the optical element of Example 1 as reliability tests.

[Details of Reliability Tests]
(Salt Water Cycle Test)

A resistance to corrosion attributed to salt water was evaluated by a method in accordance with JIS Standard (JIS H 8502). Specifically, 9 cycles of subjecting the optical element to a salt-water spraying for 8 hours and then leaving the optical element to stand in a moisture condition for 16 hours were conducted by using a salt-water-spray testing machine (model STP200 manufactured Suga Test Instruments Co., Ltd.) with 5% salt water solution.

(Moist Heat Test)

A resistance to degradation attributed to moist heat was evaluated by a method in accordance with JIS Standard (JIS C 60068). Specifically, the optical element was left to stand for 1000 hours under the condition of (i) 110° C., (ii) 85° C./85% (iii) −40° C.

(Thermal Shock Test)

A resistance to degradation attributed to an environment of repeating high and low temperatures was evaluated by a method in accordance with JIS Standard (JIS 60068-2-14 (Na)). Specifically, more than 1000 cycles of 110° C. and −40° C. of atmosphere temperatures were conducted for the optical element. The retention time for each of 110° C. and −40° C. in one cycle was 0.5 hour.

(Chemical/Oil Resistance Test)

A resistance against the chemicals and oils used in automobile in particular was evaluated. Specifically, the optical element was immersed in each of gasoline, engine oil (manufactured by ENEOS), car cleaner (manufactured by CPC), alkali cleaning liquid (manufactured by KARCHER), and NaOH aqueous solution for a predetermined time.

[Evaluation on Reliability Tests]
(Contact Angle)

As for the optical element after each of the above reliability tests, an angle of contact with water was measured. Specifically, the water contact angle was measured by putting a water droplet of about 1 µL onto the surface of the stack covering of the optical element at a point in time after each of the above reliability tests. The term "water contact angle" used herein means an angle formed by solid surface and tangent line to water surface at contact point of solid and water. The larger water contact angle indicates that the fluorine compound-containing layer of the stack covering effectively remains. Specifically, the measurement of the water contact angle was conducted at five points of the stack covering surface. The case with the water contact angles of all the five points being 100° or more was evaluated as "Good" (i.e., "○"). While on the other hand, another case with the water contact angles of any one of the nine points being less than 100° was evaluated as "Bad" (i.e., "X"). The results are shown in Table 4. As for the case where the base material had a lens shape, the measurement was conducted only at the apex point thereof.

As can be seen in Table 4, the sample after each of the above tests had the favorable contact angle. This indicates that the optical element according to the present disclosure has the fluorine compound-containing layer whose water repellency is hard to be impaired even under the severe environment. Namely, it can be found out that the fluorine compound-containing layer of the optical element according to the present disclosure can effectively remain even when put under the severe environment.

(Changed Amount of Spectral Reflectivity)

As for the optical element after each of the above reliability tests, a reflection of visible light was measured. Specifically, a spectral reflectivity was measured in the wavelength region of 400 nm to 700 nm at the light incident angle of 0° as for the surface of the stack covering of the optical element at a point in time after each of the above reliability tests. The measured spectral reflectivity was calculated as an averaged one in such wavelength. The spectral reflectivity was measured at the same point in the surface of the stack covering of the optical element. A reflectance analyzer (model USPM-RU manufactured by OLYMPUS Corporation) was used for the measurement of the spectral reflectivity. Finally, the changed amount of the spectral reflectivity in the optical element was calculated between the averaged values of the spectral reflectivity at a point in time before and after each of the above tests. The results are shown in Table 4.

As can be seen in Table 4, the sample after each of the above tests had the small amount of the changed spectral reflectivity. This indicates that the optical element according to the present disclosure has the stack covering whose antireflection function is hard to be impaired even under the severe environment. Namely, it can be found out that the stack covering layer of the optical element according to the present disclosure can effectively remain even when put under the severe environment.

TABLE 4

| Test Item | | Contact Angle | Amount of change of spectral reflectivity |
|---|---|---|---|
| Antiweatherability | | ○ | <0.3% |
| Wear resistance | | ○ | <0.4% |
| Salt water resistance | | ○ | <0.3% |
| Moist heat resistance | 110° C. | ○ | <0.3% |
| | 85° C. 85% | ○ | <0.3% |
| | −40° C. | ○ | <0.3% |
| Thermal shock resistance | | ○ | <0.3% |
| Chemical | Gasoline | ○ | <0.4% |

TABLE 4-continued

| Test Item | | Contact Angle | Amount of change of spectral reflectivity |
|---|---|---|---|
| resistance/ Oil resistance | Engine oil | ○ | <0.4% |
| | Car cleaner | ○ | <0.4% |
| | Alkali cleaning liquid | ○ | <0.4% |
| | NaOH aqueous solution | ○ | <0.4% |

Although some embodiments of the present disclosure have been hereinbefore described, they are only for illustrative purpose regarding the typical ones just as an example. The optical element according to the present disclosure and the manufacturing method therefor are not limited to these embodiments. It would be readily appreciated by those skilled in the art that various embodiments are possible for the present disclosure.

For example, a gas-phase method for forming the optical multi-layered part and the outermost surface part of the stack covering has been mainly described above, but the present invention is not necessarily limited to that. The optical multi-layered part and/or the outermost surface part of the stack covering may be formed by a wet application method of at least one selected from the group consisting of spin, float coat, dipping, spray and ink-jet.

INDUSTRIAL APPLICABILITY

As described above, the present disclosure can be applied to the field of optical elements that are required to have high visible light transmittance. Just as an example, the optical element according to the present disclosure can contribute to a realization of various optical units such as imaging units (e.g., a camera lens for a surveillance system for disaster prevention/crime prevention, and also a lens for vehicle-mounted view cameras, etc.), optical element lens barrel units, and optical pickup units; various optical systems such as high-definition imaging optical systems, objective optical systems, scanning optical systems, and pickup optical systems; imaging devices; optical pickup devices; and optical scanning devices.

DESCRIPTION OF REFERENCE NUMERALS

10: Base material
20: Stack covering of layers
22: Outermost surface part
22A: Fluorine compound-containing layer
22B: Silicon oxide-containing layer
22C: Mixture layer
23: Optical multi-layered part
23H: High refractive index layer
23L: Low refractive index layer
100 Optical element

The invention claimed is:

1. An optical element comprising a base material and a stack covering of layers formed on the base material, wherein:
    the stack covering is composed of an optical multi-layered part and an outermost surface part,
    the outermost surface part comprises a silicon oxide-containing layer and a fluorine compound-containing layer, and the fluorine compound-containing layer is a layer having bumps and dents of surface, and
    an occupancy ratio of the bumps regarding the bumps and dents of surface is 3% or more and 20% or less in the fluorine compound-containing layer.

2. The optical element according to claim 1, wherein a mixture layer in which a fluorine compound and a silicon oxide are mixed to each other is provided between the fluorine compound-containing layer and the silicon oxide-containing layer.

3. The optical element according to claim 1, wherein a thickness difference in the bumps and dents of surface is 10 nm or more and 80 nm or less.

4. The optical element according to claim 1, wherein, in a cross-sectional image of the optical element, a visible interface is provided between the optical multi-layered part and the outermost surface part.

5. The optical element according to claim 1, wherein a fluorine compound included in the fluorine compound-containing layer is a perfluoro alkyl ether group-containing compound.

6. The optical element according to claim 1, wherein a minimum thickness of the fluorine compound-containing layer is 3 nm or more and 25 nm or less.

7. The optical element according to claim 1, wherein the optical multi-layered part is composed of a high refractive index layer having a relatively high refractive index and a low refractive index layer having a relatively low refractive index, the high refractive index layer and the low refractive index layer being alternately stacked on each other.

8. The optical element according to claim 1, wherein the optical multi-layered part has a stacked form of 4 or more layers.

* * * * *